(12) United States Patent
Poenar et al.

(10) Patent No.: US 8,093,633 B2
(45) Date of Patent: Jan. 10, 2012

(54) METHOD AND DEVICE FOR WAVELENGTH-SENSITIVE PHOTO-SENSING

(75) Inventors: Daniel Pulu Poenar, Singapore (SG); Mihaela Carp, Singapore (SG)

(73) Assignee: Nanyang Technological University, Singapore (SG)

( * ) Notice: Subject to any disclaimer, the term of this patent is extended or adjusted under 35 U.S.C. 154(b) by 1234 days.

(21) Appl. No.: 10/587,493

(22) PCT Filed: Feb. 17, 2005

(86) PCT No.: PCT/SG2005/000043
§ 371 (c)(1),
(2), (4) Date: Jan. 29, 2007

(87) PCT Pub. No.: WO2005/078801
PCT Pub. Date: Aug. 25, 2005

(65) Prior Publication Data
US 2007/0170537 A1 Jul. 26, 2007

Related U.S. Application Data

(60) Provisional application No. 60/544,496, filed on Feb. 17, 2004.

(51) Int. Cl.
*H01L 31/112* (2006.01)
(52) U.S. Cl. .............................. 257/257; 257/E31.073
(58) Field of Classification Search .......... 257/431–466, 257/256, 257, 258, E31.073–E31.085
See application file for complete search history.

(56) References Cited

U.S. PATENT DOCUMENTS

| | | | | |
|---|---|---|---|---|
| 3,985,449 A | * | 10/1976 | Patrin | ............................ 356/402 |
| 4,241,358 A | * | 12/1980 | Wade | ............................ 327/377 |
| 4,318,115 A | | 3/1982 | Yoshikawa et al. | |
| 4,749,851 A | * | 6/1988 | Wolffenbuttel | ............... 250/226 |
| 5,113,076 A | | 5/1992 | Schulte | |

(Continued)

FOREIGN PATENT DOCUMENTS

| EP | 1 006 585 A1 | 6/2000 |
|---|---|---|
| JP | 07-038136 | 2/1995 |
| SU | 1689768 A1 | 11/1991 |

OTHER PUBLICATIONS

PCT International Preliminary Report on Patentability for PCT/SG2005/000043, completed Jan. 9, 2006, 3 pgs.

(Continued)

*Primary Examiner* — Ha Tran T Nguyen
*Assistant Examiner* — Kevin Quinto
(74) *Attorney, Agent, or Firm* — Venable LLP; Robert S. Babayi

(57) ABSTRACT

A semiconductor device includes a conducting channel (130) formed beneath a substrate surface with a pre-determined photo-conductivity spectral response. The channel is formed between two pn-junctions (126, 128) defining first and third photo-electric depletion regions at respective depths relative to the surface corresponding to penetration depths of light of different wavelengths. The first region (106) which has the light absorbing surface (104) above the first pn-junction (126) is specific to a first color. The channel region (130) between the two pn-junctions (126, 128) is photo-conductive to a second color. The third region below the second pn-junction (128) is sensitive to a third color. Electrical contacts (118, 120, 122, 124) are disposed on the source (112), the top gate (106), the drain (114) and the bottom gate (116) for receiving the electrical currents induced by the presence of the absorbed wavelengths.

6 Claims, 20 Drawing Sheets

U.S. PATENT DOCUMENTS 5,965,875 A     10/1999   Merrill
6,157,035 A * 12/2000   Kuijk et al. ............. 250/370.14

OTHER PUBLICATIONS

PCT International Search Report on Patentability for PCT/SG2005/000043, mailed May 4, 2005, 4 pgs.

PCT Written Opinion for PCT/SG2005/000043, mailed May 4, 2005, 4 pgs.

Xiao, Hong "Introduction to Semiconductor Manufacturing Technology," 2001, Cover, Title Page, Copyright Page, Table of Contents, pp. 87-90, 129-133, 315, 345-347, 362, 384-385, 553-557, 583-586, and 604, Prentice-Hall, Inc., Upper Saddle River, New Jersey.

* cited by examiner

METHOD AND DEVICE FOR WAVELENGTH-SENSITIVE PHOTO-SENSING

CROSS-REFERENCE TO RELATED APPLICATIONS

This is a National Phase of International Application No. PCT/SG2005/000043, filed on Feb. 17, 2005, which claims priority from U.S. provisional application No. 60/544,496, entitled "COLOR SENSORS BASED ON J(FET) STRUCTURES" and filed Feb. 17, 2004, which is incorporated herein by reference.

FIELD OF THE INVENTION

The present invention relates generally to photo-sensing, and more particularly to methods and devices for wavelength-sensitive photo-sensing.

BACKGROUND OF THE INVENTION

Wavelength-sensitive photo-sensing (often referred to as color sensing) has applications in a wide range of fields such as medicine and biology, the food, printing, and cosmetics industries, and the like. For example, in the study of cells and tissues, it may be necessary to monitor or detect the transmission and absorption of light of a certain bandwidth by cells and tissues under study.

Semiconductor-based color sensors are known. These sensors typically operate based on the differential absorption of visible light in a solid material such as silicon (Si) based on wavelength. That is, longer wavelength light can penetrate deeper below the surface than shorter wavelength light. Secondly, light is absorbed in photoelectric processes as it interacts with, and loses energy to, electrons in its path. In a semiconductor, when a non-conductive electron obtains sufficient energy, it is excited to the conduction band. This transition generates an electron in the conduction band and a hole in the valence band, both of which can be free-carriers. Thus, a beam of light incident on a semiconductor can generate free-carriers at different depths in the semiconductor depending on its wavelength. Advantageously, free-carriers generated in a depleted region, developed around a reverse biased pn-junction, can be detected by sensing a current from the depleted region. The sensed current can thus indicate the intensity of light absorbed in the depleted region. Therefore, depleted regions formed at different depths in a semiconductor can be used to sense different spectral components of the incident light.

As an example, the spectrum of visible light can be typically resolved into three components: blue, green, and red, which penetrate increasingly deeper into a semiconductor. To detect these three spectral components, the depth of a depletion region of a pn junction may be varied by adjusting the pn junction reverse bias voltage, thus obtaining measurements for the three different components. However, this technique has a disadvantage—it cannot detect different components simultaneously. Alternatively, multiple pn-junctions, may be vertically stacked, to create multiple depleted regions at different depths, so that multiple spectral components can be simultaneously measured.

The known vertically-stacked-junctions, however, also suffer certain shortcomings. For example, for each spectral component, a separate pn-junction is required. To detect three components of light, three pn-junctions are required. This requirement limits the minimum size of each sensing unit and thus the spatial resolution of the sensor.

Accordingly, there is a need for improved methods and devices for sensing color.

SUMMARY OF THE INVENTION

A semiconductor device includes a conducting channel formed in a substrate. The channel is beneath a surface of the substrate and has a pre-determined photo-conductivity spectral response. The device further includes one or more pn-junctions defining depletion regions beneath the surface, at respective depths relative to the surface corresponding to penetration depths of light of different wavelengths. Output signals respectively derived from the channel and the depletion regions indicative of the intensity of light absorbed therein can be developed and sensed to determine the spectral components of light incident on the surface.

Therefore, in an aspect of the present invention, there is provided a semiconductor device. The device includes a substrate having a surface; a first pn-junction defining a first depletion region formed on the substrate at a first depth relative to the surface, and a second pn-junction defining a second depletion region formed on the substrate at a second depth relative to the surface deeper than the first depth. A doped, photo-conductive channel is formed on the substrate between the first and second pn-junctions. The first and second depths are chosen to generate (i) charge carriers in the first depletion region in response to light of a first wavelength band incident on the surface, (ii) charge carriers in the second depletion region in response to light of a second wavelength band incident on the surface, and (iii) charge carriers in the channel in response to light of a third wavelength band incident on the surface. Doped drain and source regions are formed on the substrate in communication with the channel. Electrical interconnects are provided and are in communication with the source and drain regions and the first and second pn-junctions, respectively. Thus, incident light on the surface at the first, second, and third wavelength bands may be detected through currents through the electrical contacts.

In another aspect of the present invention, there is provided a semiconductor device. The device includes a substrate having a surface. A doped, photo-conductive channel of a first conductive type is formed on the substrate beneath the surface. The channel has a bottom at a first depth relative to the surface. Doped drain and source regions are formed on the substrate beneath the surface in communication with the channel. The source region has a bottom at a second depth relative to the surface. The drain region has a bottom at a third depth relative to the surface. A doped gate region of an opposite, second conductive type is formed on the substrate beneath and adjoining the channel and the source and drain regions, thus forming a pn-junction defining a depletion region. The first depth is chosen to generate charge carriers in the channel in response to light of a first wavelength band incident on the surface. The second depth is chosen to generate charge carriers in the depletion region proximate the bottom of the source region in response to light of a second wavelength band incident on the surface. The third depth is chosen to generate charge carriers in the depletion region proximate the bottom of the drain region in response to light of a third wavelength band incident on the surface. Electrical interconnects in respective communication with the source and drain regions, and the pn-junction are provided. Thus, incident light on the surface at the first, second, and third wavelength bands may be detected through currents through the electrical interconnects.

In another aspect of the present invention, there is provided a photo-sensing device having a plurality of photo-sensing units. Each unit is a semiconductor device described in the two preceding paragraphs.

In another aspect of the present invention, there is provided a method of photo-sensing. In this method, a junction field effect transistor (JFET) is biased to generate a conducting channel between a source and a drain of the JFET, and one or more depleted regions below the light-transmitting surface. The conducting channel has an absorption section below a light-transmitting surface of the JFET. The absorption section has a pre-determined photo-conductivity spectral response. Each depletion region has a photo-electric spectral response peaking at a distinct, pre-determined wavelength. The light-transmitting surface is illuminated with light. Output signals are sensed, which are respectively derived from the channel indicative of the intensity of light absorbed therein, and from each depleted region indicative of the intensity of light absorbed therein.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures, which illustrate, by way of example only, embodiments of the present invention.

DETAILED DESCRIPTION

Color sensing based on pn-junctions takes advantage of the photoelectric effect and the generation of free carriers by light absorption in depletion regions developed around the pn-junctions. The carriers can be collected and detected by sensing a current across each pn-junction.

Another property of semiconductors that can also be utilized for sensing light is photo-conductivity. Many semiconductors exhibit photo-conductivity. As can be understood, the conductance of a conductive path in a photo-conductive semiconductor can be affected by the absorption of light therein because of the free carriers generated due to photoelectric effect. The conductance can increase when light is absorbed. Within a limit, the higher the light absorption, the higher the conductance. Since light absorption is wavelength dependent, the photo-conductivity of a conductive path has a particular spectral response. A conductive path at a particular depth in a semiconductor is more sensitive to light of a particular wavelength band than light outside the band. A spectral response peaks at a particular wavelength, which can be measured by illuminating the conductive path with light of equal intensity but different wavelengths and finding the maximum conductance as a function of wavelength. Therefore, a conductive path generated in a semiconductor can be used for sensing color, in a manner somewhat similar to a depleted region, as will be illustrated with the exemplary embodiments of the present invention described below.

Figure 1A:
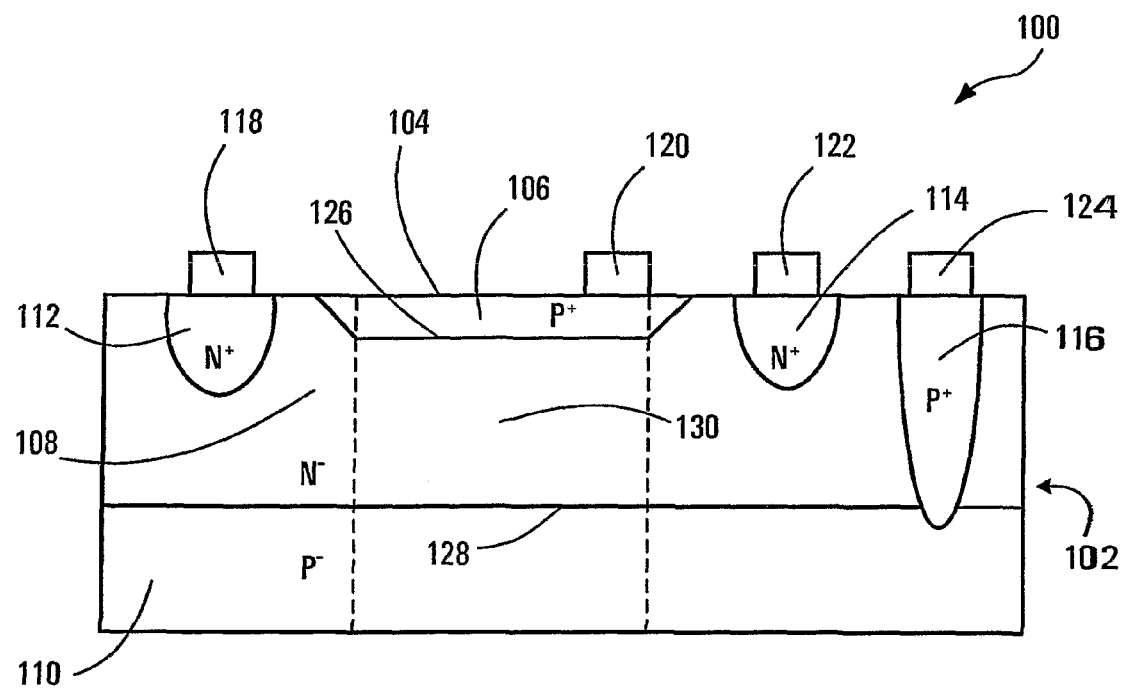
FIG. 1A is a schematic cross-sectional view of a photo-sensing semiconductor device, exemplary of an embodiment of the present invention.

FIG. 1A depicts a photo-sensing semiconductor device 100, exemplary of an embodiment of the present invention. Device 100 includes a silicon semiconductor substrate 102, which has a light-transmitting surface 104 exposed to incident light. A light receiving region below exposed surface 104 is marked by dashed lines. It should be understood that the dashed lines are meant to facilitate understanding and are not meant to mark the exact boundaries of the light receiving region.

Below exposed surface 104, there are three doped regions or layers: top gate ($G_1$) layer 106, channel layer 108 and bottom gate ($G_2$) layer 110. The doping properties of these layers, and other regions described later, are indicated using conventional symbols. Specifically, the letters "P" and "N" indicate the conductive type of the layer or region. The relative doping concentration is indicated by "+" (high), no sign (normal), or "−" (low). Thus, layers 106 and 110 are of p-type, the former more strongly doped than the latter; and layer 108 is of n-type, normally doped. Channel layer 108 connects and is in communication with a source (S) region 112 and a drain (D) region 114, both of which have high n-type doping concentrations. A strongly doped p-type gate contact region 116 extends from bottom gate layer 110 to the surface of substrate 102 for efficient contact.

As will become apparent, the concentrations of these layers and regions may vary. For example, the doping concentrations may be $10^{15}$-$10^{16}$ cm$^{-3}$ for "P−" regions, $10^{16}$-$10^{18}$ cm$^{-3}$ for "P" regions, on the order of $10^{19}$ cm$^{-3}$ for "P+" regions, $10^{14}$-$10^{15}$ cm$^{-3}$ for "N−" regions, $10^{15}$-$10^{19}$ cm$^{-3}$ for "N" regions, and on the order of $10^{20}$ cm$^{-3}$ for "N+" regions. Conducting layer 108 and bottom gate layer 110 may have comparable or very different doping levels, as detailed below.

On each of source region 112, top gate layer 106, drain region 114, and bottom gate contact region 116, there is an electrode, respectively electrode 118, 120, 122 or 124. These electrodes, also known as contacts in the art, form electric interconnects in communication with the respective regions for biasing the respective regions and for sensing electric currents therefrom.

It may be possible and necessary to include insulating layers for electric insulation and/or a mask or masking layer for blocking light from transmitting to certain regions of the substrate. However, for ease of understanding, any possible or necessary insulating layers are omitted in FIG. 1A, and in the subsequent drawings unless otherwise indicated. The mask or mask layer is also omitted in most cases. Persons skilled in the art will understand when such a layer is required or can be added.

As can be understood by persons skilled in the art, a junction field-effect transistor (JFET) structure (including source and drain regions 112 and 116 and channel layer 108 and a gate layer) is formed on substrate 102. As depicted in FIG. 1A, the three layers 106, 108 and 110 can be considered a JFET structure and the two pn-junctions 126 and 128 are conveniently formed between a gate and the channel. However, as will become apparent from description below, one pn-junction may be sufficient for certain applications and a pn-junction can be formed away from the JFET structure.

In conventional terminology, the JFET depicted in FIG. 1A is an n-channel JFET. Source and drain regions 112 and 116 of the JFET can be biased to develop a conducting channel therebetween. As depicted, channel layer 108 defines a light-absorption section 130 below surface 104 between the dashed-lines. Light-absorption section 130 has a photo-conductivity spectral response dependent on the material of channel layer 108 and the depths of top and bottom junctions 126 and 128, as will be further described below.

The photo-conductivity spectral response of light-absorption section 130 can be pre-determined. For example, the spectral response may peak at a pre-determined wavelength. As will be appreciated, in practice it can be difficult to obtain a peak at an exact wavelength. Further, the peak may shift due to various processing and operational factors. Thus, it should be understood that as used herein, "at" a wavelength means "at or near" the wavelength in normal operating conditions. The allowable range of variation can be readily determined by persons skilled in the art in a given application. As will be further described below, an output signal can be derived from the channel of the JFET to detect light absorbed therein.

Further, the three layers 106, 108 and 110 form two vertically-stacked pn-junctions, top junction 126 and bottom junction 128, which are substantially vertically aligned one above another relative to surface 104. Channel layer 108 is positioned between junctions 126 and 128. Junction 126 or 128 can be reverse-biased so that a depleted (or depletion) region develops therefrom. Each depleted region has a photo-electric spectral response to light incident on surface 104, which is dependent on the depth of the corresponding pn-junction and the biasing voltage applied across the pn-junction. In this description, "depth" is always relative to the light-transmitting surface of the substrate, such as surface 104, unless otherwise indicated. The depths of the pn-junctions are chosen so that the depletion regions and the channel can have different spectral responses to light incident on surface 104. Specifically, the depths are chosen to generate (free) charge carriers in the depletion regions and the conducting channel in response to light of different wavelength bands incident on surface 104, respectively. Output signals, such as current signals, can thus be derived from each depletion region and the channel, through the electrodes, to detect light respectively absorbed therein. For example, top junction 126 may be at a depth from 0.02 to 0.5 micron so that a blue component of light is absorbed in the top depletion region, and bottom junction 128 may be at a depth from 2 to 10 microns so that a green component of light is absorbed in section 130 of channel 108 and a red component of light is absorbed in the bottom depletion region.

The thickness and material of layers 106, 108 and 110 can be chosen so that a top depletion region can be developed from top junction 126 which has a photo-electric spectral response peaking at a first pre-determined wavelength, such as about 400 nm; a bottom depletion region can be developed from bottom junction 128 which has a photo-electric spectral response peaking at a second pre-determined wavelength, such as about 700 nm; and the photo-conductivity spectral response of light-absorption section 130 peaks at a third pre-determined wavelength, such as about 550 nm. As can be understood by persons skilled in the art, the shape and sizes of layers 106, 108 and 110 may vary depending on the materials used and the particular selection of the pre-determined wavelengths. Further, other processing and operational factors, including environmental factors such as temperature, may also affect each spectral response.

When viewed from the top, device 100 and its various layers and regions may have any suitable shape and size. For example, each of top gate layer 106 and source and drain regions 112 and 114 may be generally circular or rectangular.

The different layers and regions as well as the electrodes of device 100 can be formed using suitable known semiconductor manufacture techniques, as can be understood by persons skilled in the art.

For example, channel layer 108 may be epitaxially grown on bottom gate layer 110, and may have a thickness from about 2 to about 10 μm; top gate layer 106 may be formed by diffusion and may have a thickness from about 0.02 to about 0.5 μm depending on the spectral characteristics to be detected. The maximum depth of source and drain regions 112 and 114 may be between 0.5 to 1 μm or between 3 to 4 μm, depending on whether it is more desirable to minimize lateral diffusion or to have a lower channel resistance. As will become apparent, small lateral sizes (in the horizontal direction in FIG. 1A) may be desirable for achieving high resolution of imaging. When desired, shallow and very strongly doped n-type regions (not shown in FIG. 1A) may be formed near surface 104 within regions 112 and 114 for providing improved ohmic contact.

Bottom gate layer 110 may have a low or a high doping concentration and may have any suitable or convenient thickness, depending on the spectral range of light desired to be detected near bottom junction 128.

For example, bottom gate layer 110 may be formed from a 6-inch wafer with a thickness of about 650 μm and channel layer 108 may be an epitaxially grown on the wafer. In this case, bottom gate layer 110 may have a doping concentration (e.g. $10^{14}$ cm$^{-3}$) much lower than that of channel layer 108 (e.g. $10^{15}$-$10^{16}$ cm$^{-3}$). As can be appreciated, with this kind of doping, the depletion region developed from junction 128 will be mainly developed in bottom gate layer 110. Such an arrangement may be advantageous. For example, only a thin (~3 to 4 μm) channel layer 108 needs to be formed because the depletion region mainly extend into bottom gate layer 110. As a result, the strongly doped contacting region 116 can be short and can be conveniently formed by diffusion. This can shorten the fabrication cycle and allow for smaller lateral dimensions, which in turn may allow an increased integration density, and thus a higher resolution when the device is used as a pixel in a large imaging array.

However, in some situations it may be desirable to use a more highly doped p-type wafer for bottom gate layer 110, for example to reduce cost as lower doped wafer may be expensive to prepare. Further, a more highly doped channel may be less photo-conductive than a lower doped channel. Therefore, it may be convenient to grow epitaxially both channel layer 108 and bottom gate layer 110 from a highly or moderately doped p-type wafer. Both epitaxially grown layers can have similar doping levels and thicknesses, e.g., about 5 to 6 μm in thickness and $10^{15}$ to $10^{16}$ cm$^{-3}$ in doping concentration, but it may be advantageous if channel layer 108 is thicker and has a higher doping concentration.

Electrodes 118, 120, 122 and 124 are made of a conductive material including metals such as aluminium. Conveniently, these extend from the top surface 104 of device 100.

The operation of sensor 100 is next described with reference to both FIGS. 1A and 1B, the latter being a circuit diagram in which the JFET structure of sensor 100 is represented with conventional symbols used by persons skilled in the art.

In operation, electrodes 118, 120, 122 and 124 of device 100 are biased to generate a current through the conducting channel between source 112 and drain 114 and also to develop top and bottom depletion regions extending respectively from top and bottom junctions 126 and 128. For example, source electrode (S) 118 may be grounded, i.e. $V_s=0$; drain electrode (D) 122 may be biased to a positive voltage $V_d$, which can vary, for example, from about 3 to about 20 V, depending on the desired operation mode and desired spectral selectivity for the various output signals; top gate electrode 120 may be grounded (can be short-circuited to S electrode 118) or biased to a small negative voltage $V_{g1}$; and bottom electrode 124 may be biased to a voltage $V_{g2}$, which may vary from 0 to less than $-|V_d|$. As can be appreciated, when biased as described above, the depleted regions respectively extend along top and bottom junctions 126 and 128 and generally parallel to surface 104 within the dashed lines shown in FIG. 1A. The width of the depleted regions may be controlled by varying the biasing voltages. As the depletion regions encroach into channel layer 106, the conducting channel between the dashed lines is thinner than light-absorption section 130 but is also generally parallel to surface 104. As can be understood, drain region 114 and gate region 116 should be sufficiently remote from each other so that the depleted region developed from bottom gate contact region 116 would not reach drain region 114.

Figure 1B:
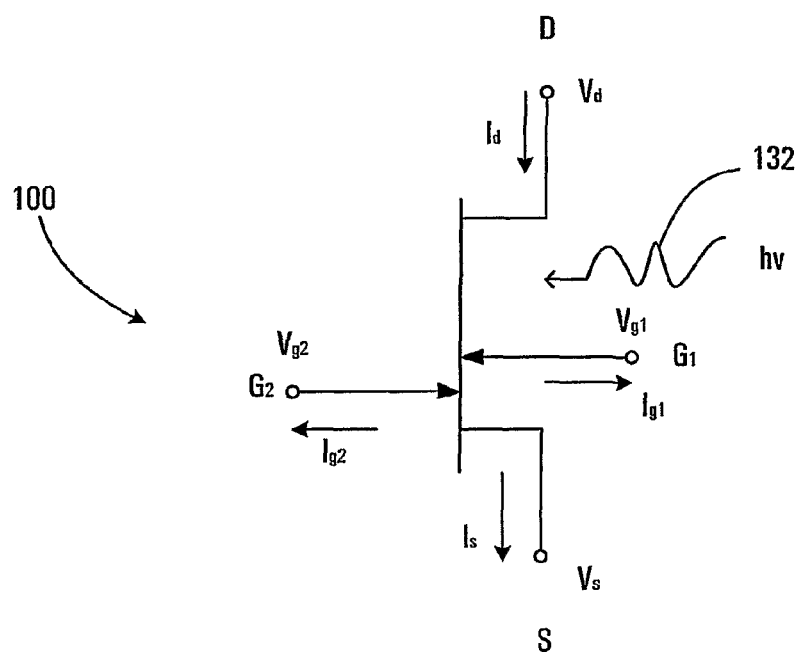
FIG. 1B is a circuit diagram showing the device of FIG. 1A in operation.

As depicted in FIG. 1B, a current (drain-source current $I_{ds}$) flows in the conducting channel from drain 114 to source 112. When surface 104 is not illuminated, there is no gate current flowing through gate electrode 120 or 124, that is, $I_{g1,0}=I_{g2,0}=0$, ignoring any leakage current, wherein subscript "0" indicate a quiescent or darkness current. Therefore, the quiescent drain-source current $I_{ds0}$ is equal to $I_{d0}$ or $I_{s0}$. Current $I_{ds0}$ can thus be detected by sensing either $I_{d0}$ or $I_{s0}$, or by averaging the two latter currents.

When light-transmitting surface 104 is illuminated with light 132 of a particular wavelengths, as indicated in FIG. 1B, light 132 is transmitted into the portion of substrate 102 delineated by the dashed lines. Different wavelength components of light 132 are absorbed at different depths. Short-wavelength components are absorbed above top junction 126, mid-wavelength components are absorbed before bottom junction 128, and long-wavelength components are absorbed below bottom junction 128. Therefore, the depletion region developed from top pn-junction 126 absorbs mainly light of short-wavelengths, the channel in light-absorption section 130 absorbs mainly light of mid-wavelengths, and the depletion region developed from bottom pn-junction 128 mainly absorbs light of long-wavelengths.

When light is absorbed, free charge carriers are generated. Holes generated in a depleted region are quickly moved towards its corresponding electrode (120 or 124) by the internal electric field, thus producing a corresponding non-zero gate current $I_{g1}$ or $I_{g2}$. The gate current $I_{g1}$ is thus indicative of light absorbed in the top depleted region (such as a blue component of incident light 132) and gate current $I_{g2}$ is indicative of light absorbed in the bottom depleted region (such as a red component of incident light 132).

Light-absorption section 130 of the channel has a conductance (or resistance) dependent on photo-absorption. When light is absorbed and free carriers are generated in this section, the conductance increases. An output signal indicative of light absorbed in the conducting channel can thus be derived from the conducting channel. For example, the drain-source current ($I_{ds}$) or the increase in drain-source current ($\Delta I_{ds}$) can indicate light absorbed in the conducting channel (such as a green component of incident light 132). At a fixed drain-source voltage ($V_d$-$V_s$), the drain-source current increases when the conductance of the conducting channel increases. The increase in drain-source current is thus indicative of light absorbed within the conducting channel, particularly in light-absorption section 130.

As illustrated, $I_d=I_s+I_{g1}+I_{g2}$, when surface 104 is illuminated. When surface 104 is not illuminated and ignoring any leakage current, $I_{d0}=I_{s0}$. It should be understood that the relationship between these currents can be more complex than described herein, depending on many factors such as the relative biasing voltages and the areas exposed to light. The simple relationships used herein are for illustration purposes only. The actual relationship between the currents and the relationship between spectral selectivity and the currents can be readily determined by persons skilled in the art. The change in drain-source current ($\Delta I_{ds}$) due to light absorbed in the conducting channel can be determined in various different ways. The simplest way to determine the change in drain-source current due only to the absorption of the green light component would be to measure directly the change in source current: $\Delta I_{ds}=I_s-I_{s0}$. However, such a measurement may not always be possible or practical. $\Delta I_{DS}$ may be determined in another suitable manner. For example, $\Delta I_{ds}$ can be calculated by subtracting from the sensed drain current $I_d$ the quiescent drain-source current $I_{ds0}$. Alternatively, drain and gate currents can be sensed and $\Delta I_{ds}$ can be calculated using the formula: $\Delta I_{ds}=I_d-(I_{g1}+I_{g2}+I_{ds0})$. $I_{ds0}$ can be made very close to zero so that $\Delta I_{ds}$ approximately equals to $I_s$, or $[I_d-(I_{g1}+I_{g2})]$.

For measuring $\Delta I_{ds}$, $I_{ds0}$ can be obtained by measurement at the time of sensing or from a pre-recorded data source. Contemporary measurement can be performed on the same sensing unit, or on an identical but separate sensing unit which is not exposed to light.

As can be understood, since only certain wavelength components of light 132 reach and are absorbed within light-absorption section 130, the drain-source current can be used, either alone or together with gate currents, to determine spectral components of light 132. For example, the blue, green and red components of light 132 may be determined using the sensed currents. The blue component may cover wavelengths from about 400 to about 500 nm, the green component may cover wavelengths from about 500 to about 600 nm, and the red component may cover wavelengths from about 600 to about 700 nm. In some applications, the blue and red components may be expanded to respectively cover shorter and longer wavelengths such as ultra-violet and infrared wavelengths. Each spectral component may also cover a narrower bandwidth so that a detailed spectral analysis of the incident light can be performed.

The spectral components of light 132 can be determined based on the sensed source, drain and gate currents, using appropriate algorithms, which can be understood and developed by persons skilled in the art. The required calculations, including the calculation of $\Delta I_{ds}$ can be performed in any suitable manner. For example, the sensed currents can be analysed to generate the desired output signal using an electric circuit or a computer. It should also be understood that it may not be necessary to actually find a value for $\Delta I_{ds}$. It is possible to obtain output signals representing the spectral components of light 132 from the sensed source, drain, and gate currents without explicitly arriving at a signal representing $\Delta I_{ds}$.

Figure 1C:
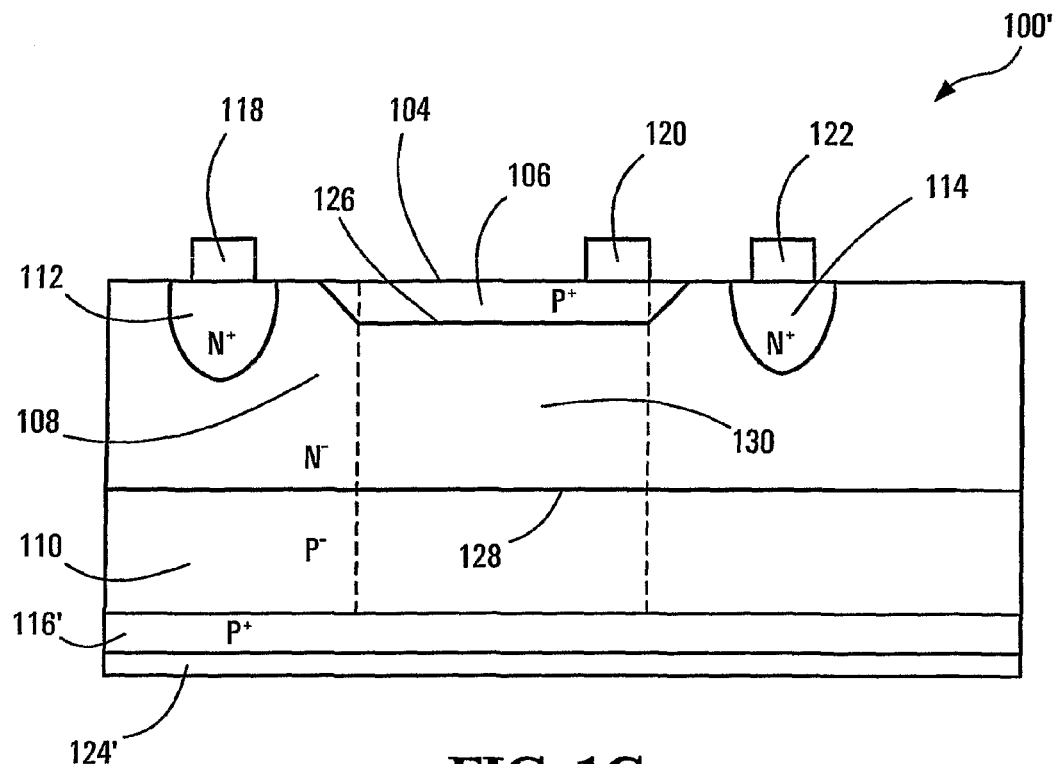
FIGS. 1C to 1H are schematic cross-sectional views of several variations of the device of FIG. 1A, exemplary of embodiments of the present invention.
Figure 1D:
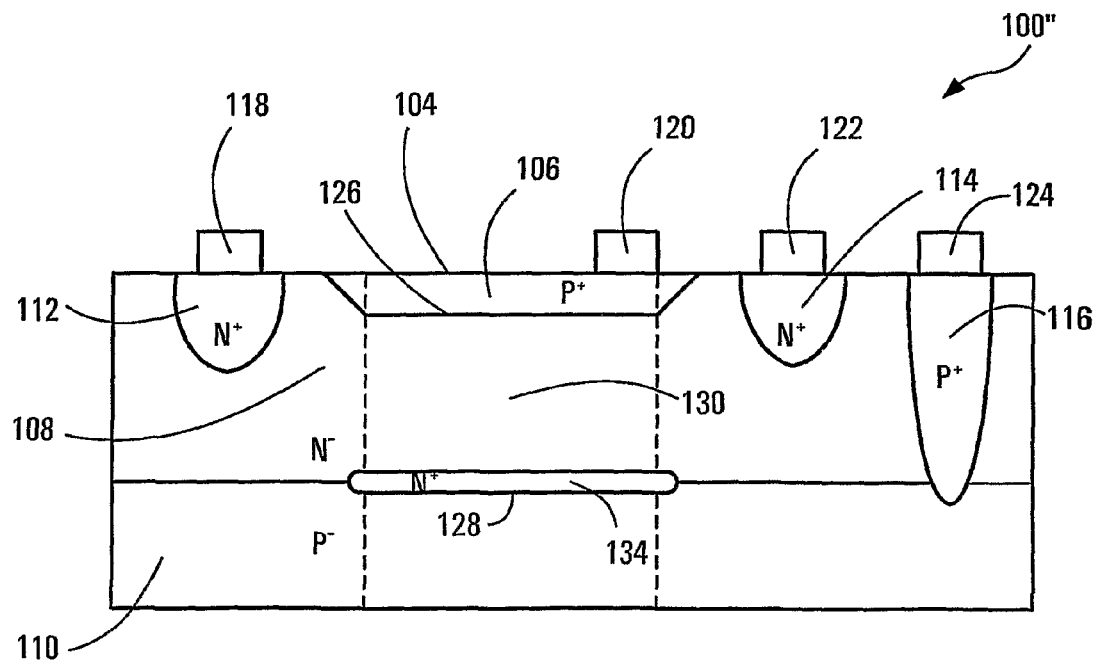
Figure 1E:
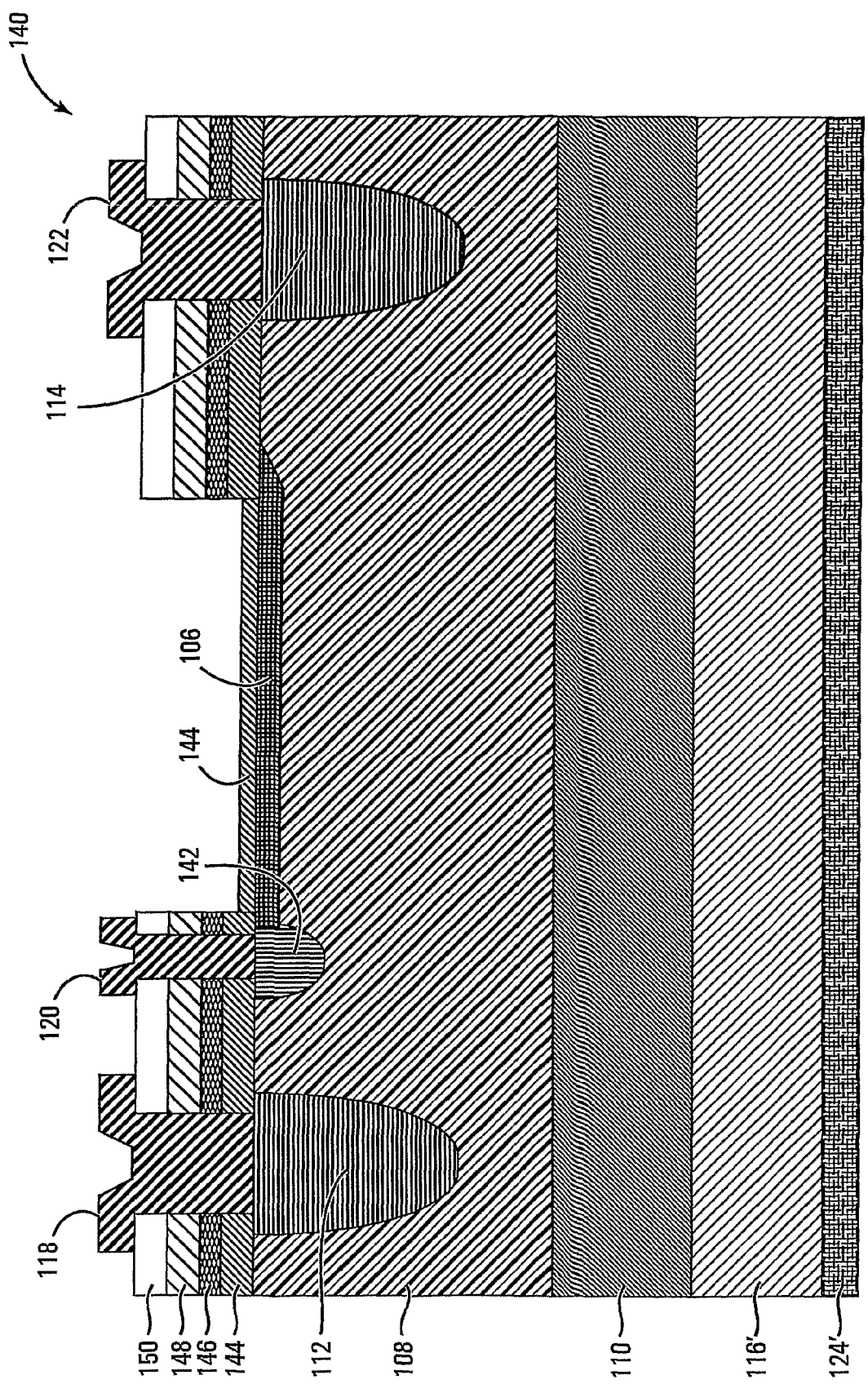
Figure 1F:
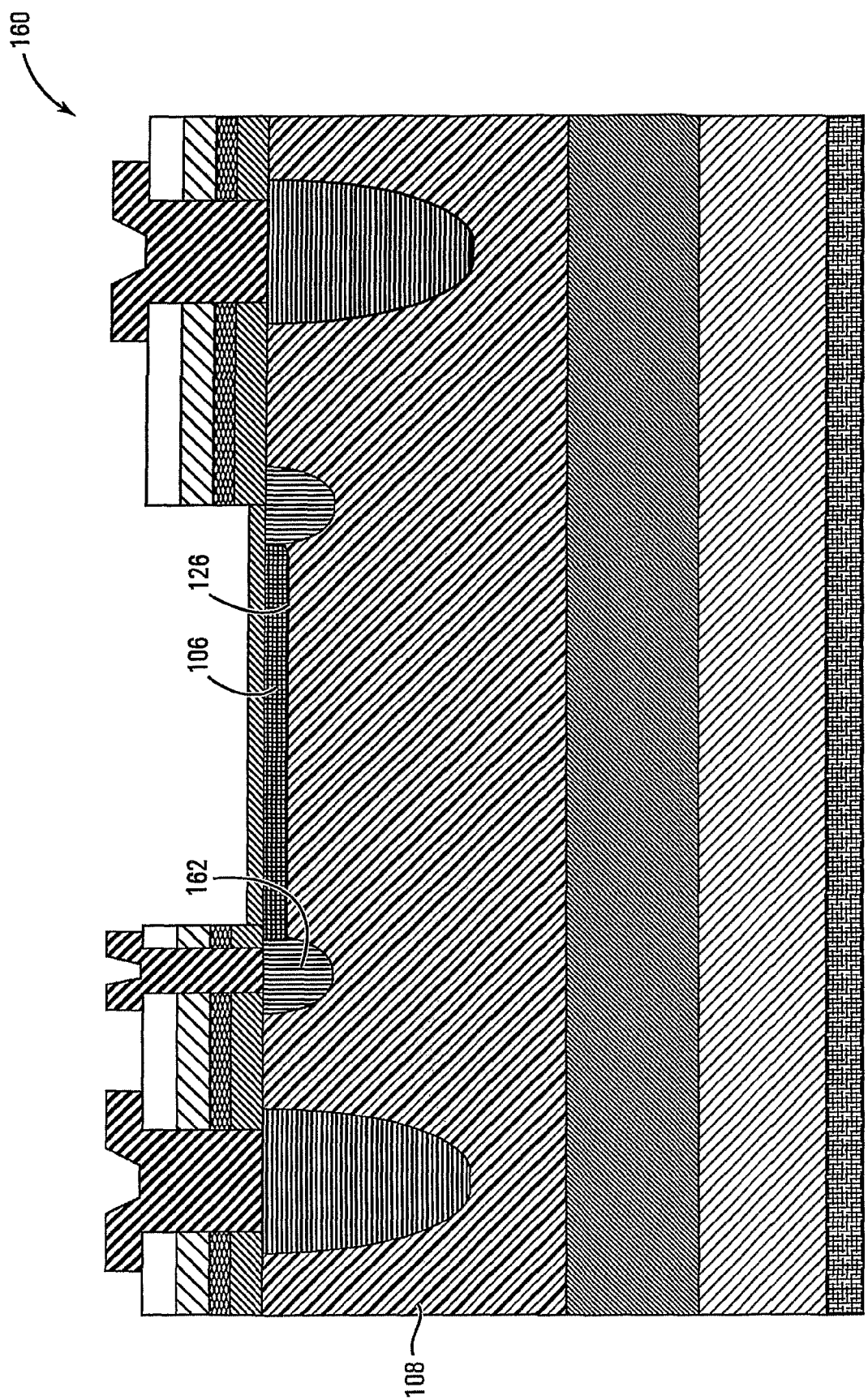
Figure 1G:
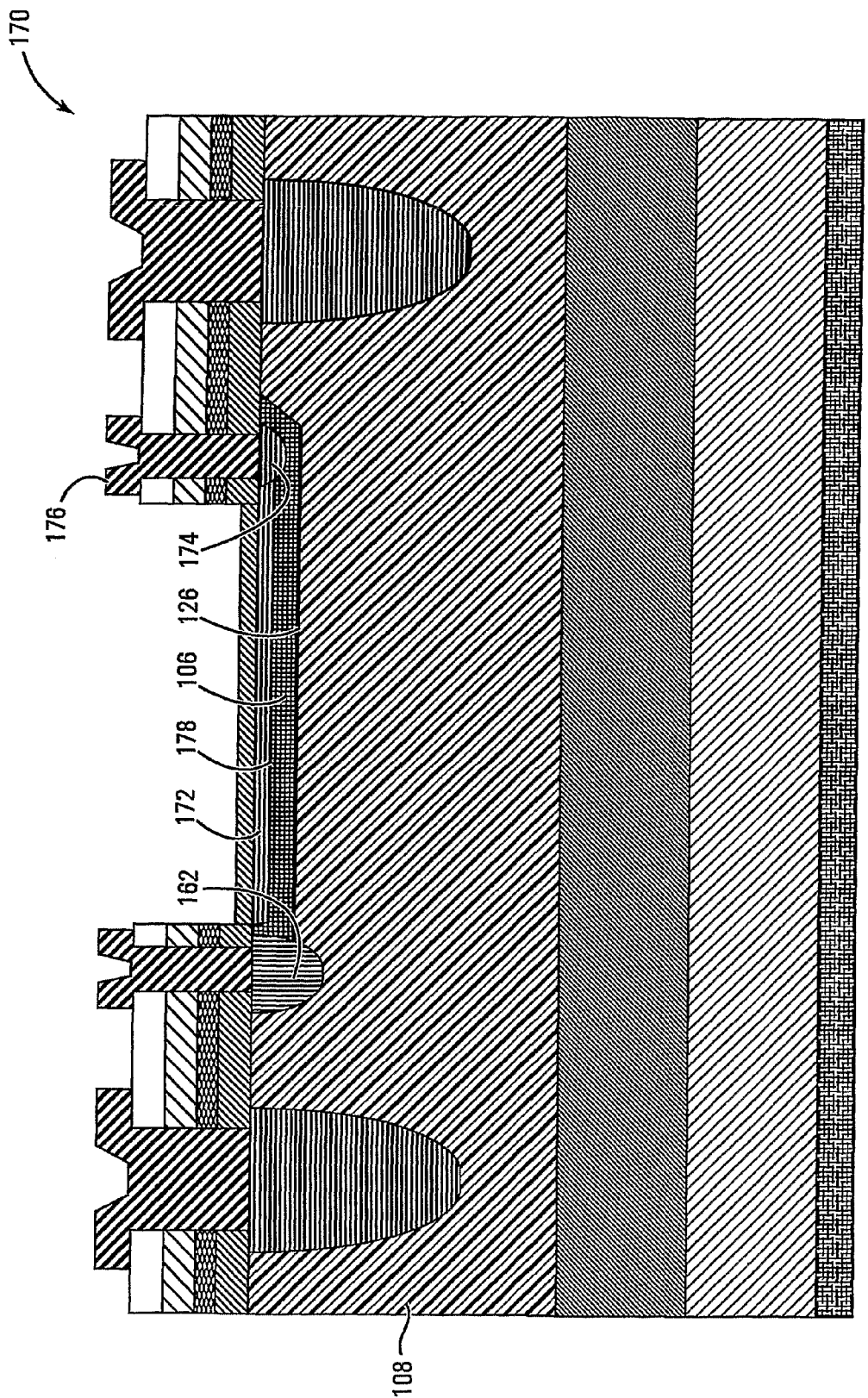
Figure 1H:
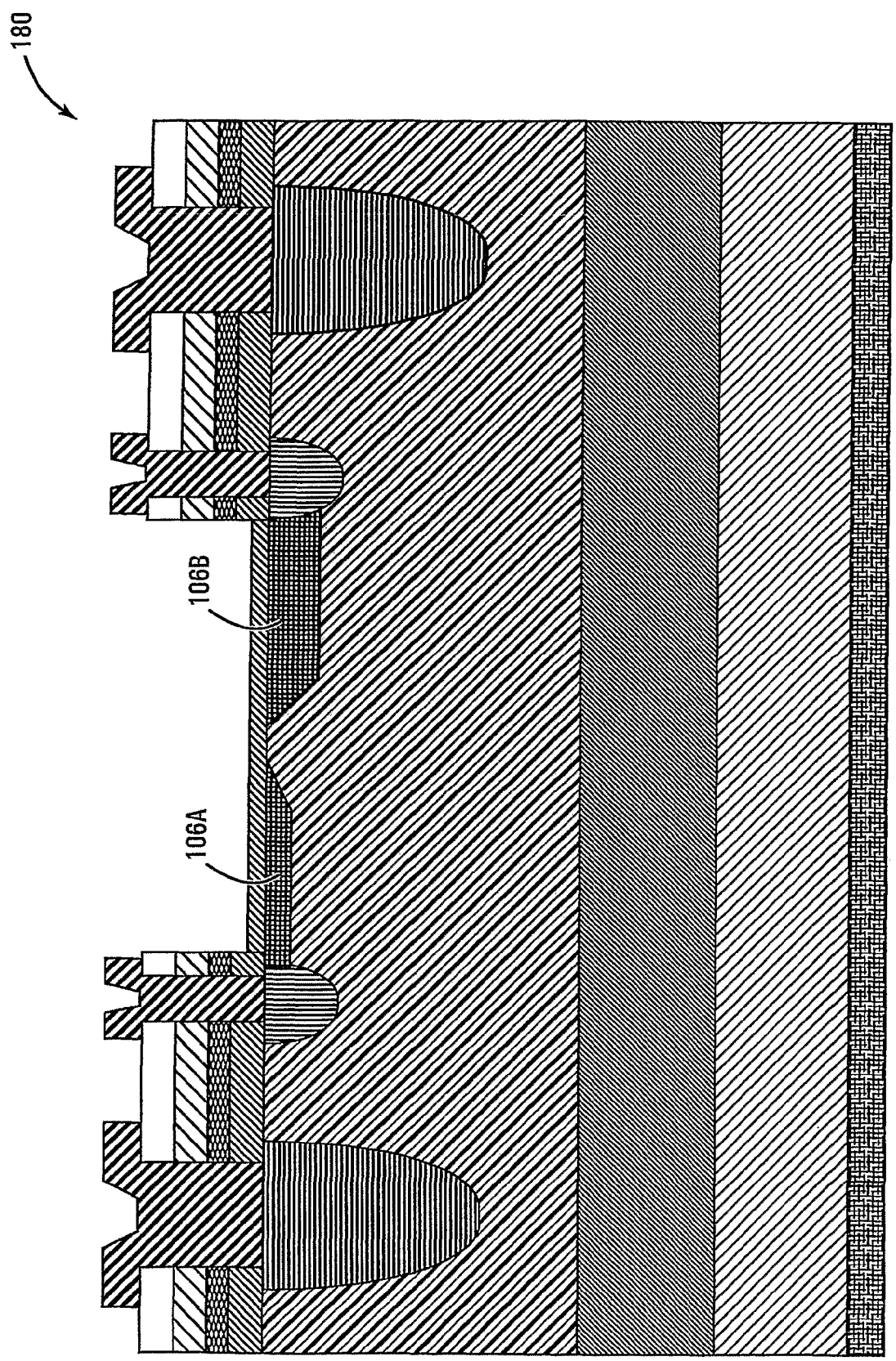
Figure 1I:
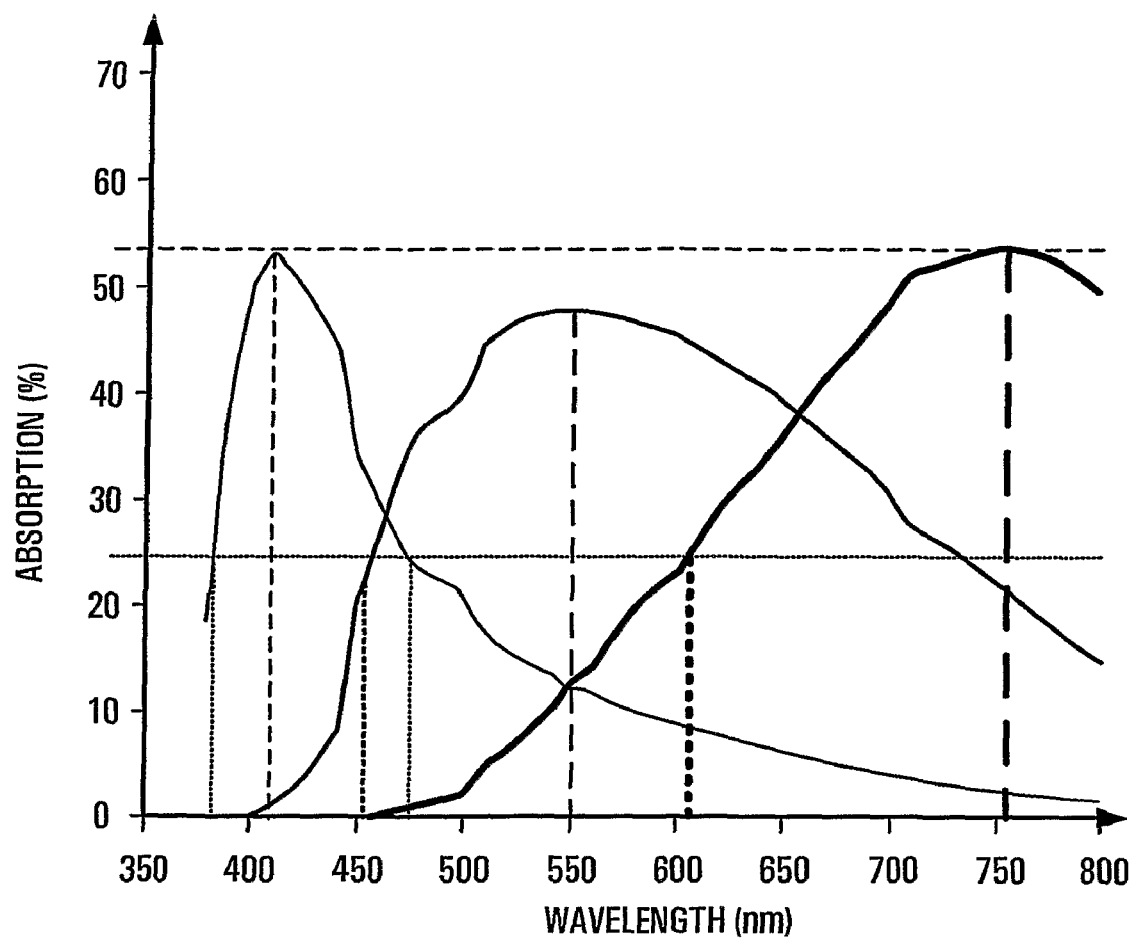
FIG. 1I is a line graph showing simulated spectral responses of light absorption regions at different depths in the device of FIG. 1A.

For illustration purposes, simulated spectral responses are shown in FIG. 1I. The substrate is assumed to be silicon-based. The curve peaking near 400 nm represents the spectral response of an absorption region at a depth of 0.05 μm and of a thickness of 0.2 μm. The curve peaking near 550 nm represents the spectral response of an absorption region at a depth of 0.65 μm and a thickness of 2 μm. The curve peaking near 750 nm represents the spectral response of an absorption region at a depth of 3 μm and of a thickness of 12 μm. In this description, the depth of a region refers to the depth of the side of the region that is near the light-transmitting surface.

As now can be appreciated, by choosing the appropriate spectral responses, including the pre-determined wavelengths or wavelength bands, for the depleted regions and the conducting channel, a desirable set of spectral components of light 132 can be determined.

Since the spectral response of a particular region depends on the depth and thickness of the region, these parameters can be varied to achieve the desired spectral response for the particular region. The spectral response of a particular region can be estimated by calculation or be experimentally determined. For example, the spectral response of the photo-conductivity of the conducting channel can be measured by illuminating light-transmitting surface 104 with light of equal intensity but different wavelengths and measuring the drain-source current variation $\Delta I_{ds}$ as a function of wavelength.

As discussed above, the peak absorption wavelength of the conducting channel is dependent on the material of substrate 102, the depths of junctions 126 and 128, as well as the biasing voltages. Therefore, the peak absorption wavelength (and the spectral response in general) can be adjusted by adjusting the biasing voltages, as can be readily understood by persons skilled in the art. In addition, the width of the conducting channel may be varied to obtain a sharper or flatter spectral response, depending on the application. Similarly, the widths of the depleted regions may also be controlled by adjusting the biasing voltages. For example, for sensing the blue component of visible light, the top depleted region may have a width of about 0.5 μm. For sensing the green component of visible light, the light absorption section of the channel may have a top depth of about 0.15 μm and a thickness of about 2 to 6 μm. It may be advantageous if the channel is about 3 to about 5 μm thick. It should be understood that the above values and other values given herein are for illustration purposes and may be varied for different applications such as different substrate materials.

In the above discussion, the biasing voltages, once applied, are kept constant during measurement. It is possible to vary biasing voltages during measurement to determine the spectral components of light 132 based on the measured I-V profiles for the respective depleted regions and conducting channel. However, the constant-biasing-voltage approach may be simpler to perform and the output signals can be easier to analyse as the depletion regions and conducting channel each has a substantially fixed shape and size.

As should now be understood, device 100 may be modified. For example, the doping types of the layers or regions may be reversed to form a p-channel JFET, which can also be used for sensing color. As can be understood, the operation of a p-channel JFET for sensing color is similar to the operations described above except that all polarities and biasing voltages should be reversed.

Further, while having all the electrodes on the same side of the substrate as in device 100 may be advantageous, it is possible to have the electrodes disposed on opposite sides of the substrate, as shown in FIG. 1C, which illustrates a modified sensor 100', exemplary of another embodiment of the present invention. Sensor 100' is similar to sensor 100 (FIG. 1A) except that the bottom gate electrode 124' is placed on the side opposite to light-absorption surface 104 and, correspondingly, the gate contact region 116' is below bottom gate layer 110. Sensor 100' can be operated in similar manner as for sensor 100.

As can be appreciated, it is also possible to control how a depleted region develops from a pn-junction by varying the relative doping concentrations of the interfacing regions. For example, when one side of a pn-region has a much-higher doping concentration than the other side, the depletion region will mainly develop in the lower doped region. This property can be advantageously utilized to control the development of depletion regions. For example, the channel can be made thin if it is much more strongly doped than the bottom gate layer so that the bottom depletion region mainly develops in the bottom gate layer. In such a case, the channel can be as thin as about 3 to 4 μm. A sensor with a thin channel can be sensitive to a narrow band of wavelengths, can be easier to manufacture, and/or can be more compact because the bottom gate contact region 116 can be shorter and smaller in lateral cross-section at the surface.

It is also possible to reverse the relative doping concentrations so that the depletion region mainly develops within the channel. In this case, the bottom gate layer can be inexpensively produced. Further, the spectral response of the conducting channel may be varied over a wider range by adjusting biasing voltages. However, if the channel layer is very thick such as thicker than about 10 μm, it could be difficult and expensive to produce a deep bottom gate contact region 116 by diffusion.

It should also be noted that when channel layer 108 and bottom gate layer 110 have very different doping concentrations, diffusion may occur at the interface and the pn-junction formed can be inferior as compared to a pn-junction formed between epitaxially grown layers having comparable doping concentrations. Thus, it may be advantageous that the doping concentrations of channel layer 108 and bottom gate layer 110 are comparable.

Another modified sensor 100" is shown in FIG. 1D. Sensor 100" is similar to sensor 100 except that a thin, strongly doped n-type layer 134 is buried between channel layer 108 and bottom gate layer 110. Layer 134 may have any suitable thickness. Buried layer 134 extends slightly beyond the light receiving region, as marked by the dashed lines. An advantage of sensor 100" is that channel layer 108 and bottom gate layer 110 can have comparable low doping strength and the bottom depleted region will still mainly develop within bottom gate layer 110. In this case, as in other exemplary embodiments, in order to minimize the sensor size, bottom gate contact region 116 may be isolated from drain region 114 using a technique known as the Shallow Trench Isolation (STI) technique, which is a standard technique in high-density complementary-metal-oxide-semiconductor (CMOS) fabrication and can be understood by persons skilled in the art. For example, example suitable techniques are described in Hong Xiao, "Introduction to Semiconductor Manufacturing Technology", Prentice Hall, 2002, which is incorporated herein by reference. Another advantage of sensor 100" as compared to sensor 100 is that the biasing voltage $V_d$ may be reduced so that the top depletion region can be thinner and/or more uniform in width.

FIG. 1E shows an example sensor 140 formed like device 100'. In sensor 140, the top gate includes a top gate layer 106 and a gate contact region 142. The non-light transmitting portion of the top surface is covered by a number of layers, including a first $SiO_2$ layer 144, which may be thermally grown, a silicon nitride layer 146, a second $SiO_2$ layer 148 which may be formed by chemical-vapour-deposition (CVD), and a third $SiO_2$ layer 150 which may be formed by plasma-enhanced CVD (PECVD). Layers 144, 146, 148 and 150 provide insulation for the substrate. As can be understood, in the fabrication process, these layers may initially cover the light-transmitting surface and are later partially removed to expose the light-transmitting surface, such as on the thinner section of layer 144. As is typical, source (including source region 112 and source electrode 118) and drain (including drain region 114 and drain electrode 122) are interchangeable. Electrodes 118, 120, and 122 are made of aluminium. The doping concentrations are respectively about $10^{16}$-$10^{18}$ $cm^{-3}$ for top gate layer 106, $5 \times 10^{15}$ $cm^{-3}$ for channel layer 108, $2 \times 10^{18}$ $cm^{-3}$ for bottom gate layer 110 and top gate contact region 142, $8 \times 10^{19}$ $cm^{-3}$ for source and drain regions 112 and 114, $4 \times 10^{15}$ $cm^{-3}$ for bottom gate contact region 116". Channel layer 108 can be about 8 μm thick, and bottom gate layer 110 can be about 3 μm thick. The thickness of top gate layer 106 can be, e.g., in the range from 50 to 250 nm. The doping material for top gate layer 106 can be boron.

In a variation of sensor 140, drain region 114 may be of p-type instead of n-type, but of the same doping concentration. In this case, the source and drain are no longer interchangeable. The drain is in effect an anode and the source is in effect a cathode. This variation can be advantageous because it is possible to enhance the total flow of carriers in the channel region, and therefore modify the spectral selectivity of the sensor, especially of the conducting channel.

FIG. 1F shows a sensor 160, modified from sensor 140. The top gate layer of sensor 160 includes a central region 106 and a protective ring 162 around a periphery of the central region. The shallow central region has a doping concentration of about $2 \times 10^{16}$ $cm^{-3}$, lower than that of protective ring 162, about $2 \times 10^{18}$ $cm^{-3}$. Top pn-junction 126 is formed between central region 106 and the channel layer 108. Ring 162 protects central region 106, preventing breakdown of the junction at very low reverse voltage, and also facilitates collection of free carriers generated in the shallow top gate region.

FIG. 1G shows a sensor 170 modified from sensor 160. The main difference between sensors 160 and 170 is the addition of a top n-type region 172, corresponding contact region 174, and electrode 176. In sensor 170, top gate layer 106 has a doping concentration of $2 \times 10^{18}$ $cm^{-3}$. Top n-type region 172 has a doping concentration of $10^{19}$ $cm^{-3}$. The pn-junction 178 between regions 106 and 172 can be used to develop a depleted region for obtaining an output signal indicating the intensity of light absorbed therein. For example, a current detected from gate region 162 can indicate light absorbed in depletion region around pn-junction 126. A current detected from gate region 174 can indicate light absorbed in depletion regions around both pn-junctions 126 and 178. Thus, light absorbed in depletion region around pn-junction 178 can also be determined. As can be appreciated, it can be easier to obtain a very shallow n-type region in a thin p-type well, than a similarly very shallow p-type region in a thin n-type layer. Since top n-type region 172 can be very thin, sensor 170 can detect light of short wavelengths.

FIG. 1H illustrates a sensor 180, modified from sensor 140. In sensor 180, there are two separated isolated p-type top gate layers 106A and 106B, each having a doping concentration of about $10^{16}$ $cm^{-3}$. Top gate layer 106A is shallower than top gate layer 106B. Thus, depleted regions developed from the two top gate layers will have different spectral responses. Alternatively, top gate layers 106A and 106B may have similar depth but different doping concentrations. They may also have both different depths and doping levels.

Figure 2:
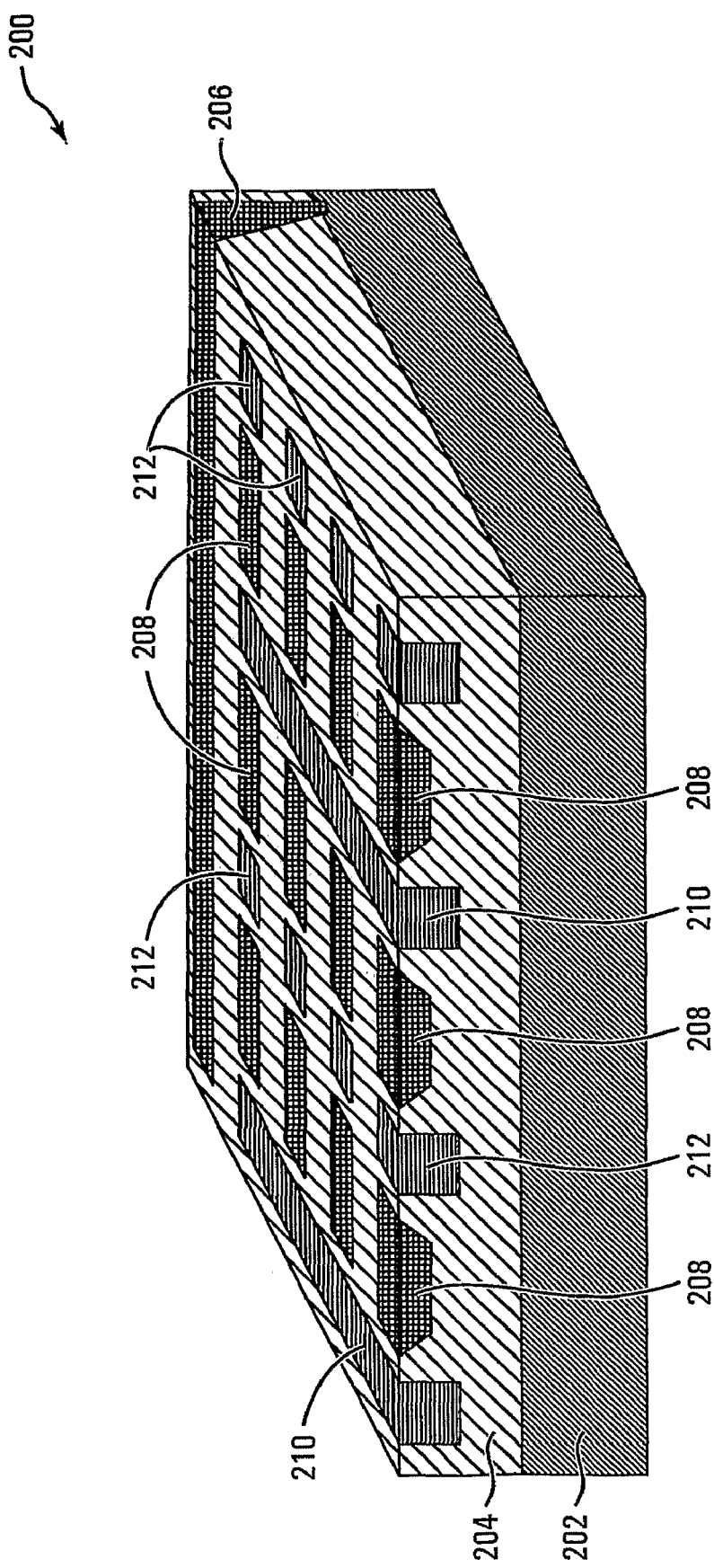
FIG. 2 is a cut-off perspective view of a sensor having multiple sensing units similar to the device of FIG. 1A.

Device 100 (or any of device 100', 100"/sensors 140, 160, 170, and 180) can be used as a stand-alone sensor or as a sensing unit in a compound photo-sensor. For example, an exemplary compound sensor 200 incorporating multiple sensing units is illustrated in FIG. 2. Sensor 200 has a bottom gate layer 202 ($p^+$), a conducting layer 204 ($n^-$), a bottom gate contact region 206 ($p^+$), and multiple top gate regions 208 ($p^+$), source regions 210 ($n^+$) and drain regions 212 ($n^+$), wherein the signs in parentheses indicate the doping type and relative strength. As depicted and as can be understood, sensor 200 effectively incorporates twelve sensing units (each being a sensor 100) having a common bottom gate contact region 206 shared by all units, each source region 210 is shared by two adjacent columns of units, and each drain region 212 is shared by two adjacent units in a row. Sensor 200 can be an imaging sensor and each unit may form a pixel of the imaging array. The sensing units may be formed in a desirable pattern other than the one depicted in FIG. 2. Each sensing unit may be individually addressed and the output signals from each sensing unit may be used to reproduce a color image of the incident light. A metal-oxide semiconductor (MOS) transistor or other "normally-off" device may be used to selectively activate the sensing units, in combination with normal addressing circuits to overcome the problem that a JFET is normally-on, as will be understood and readily implemented by persons skilled in the art. The normally-off state may be achieved in other manners, such as by forming an array of lambda-diodes as described below.

Advantageously, sensor 200 may have high spatial resolution because of sharing of source, drain and gate contact regions. Moreover, a common bottom gate contact region 206 can be disposed far from other regions so that it is well isolated. Notably, output signals for the red component of incident light may be combined and cannot be individually extracted, because the bottom gate currents are merged. This may be alleviated by applying biasing signals to the sensing units individually in sequence (scanning) so that the origin of the bottom gate current at a given time can be identified. Control and detection of signals at the different photo-sensing units can be carried out in various suitable manners. Persons skilled in art will be able to design suitable control schemes for control the signals at the different electrodes on sensor 200.

Figure 3:
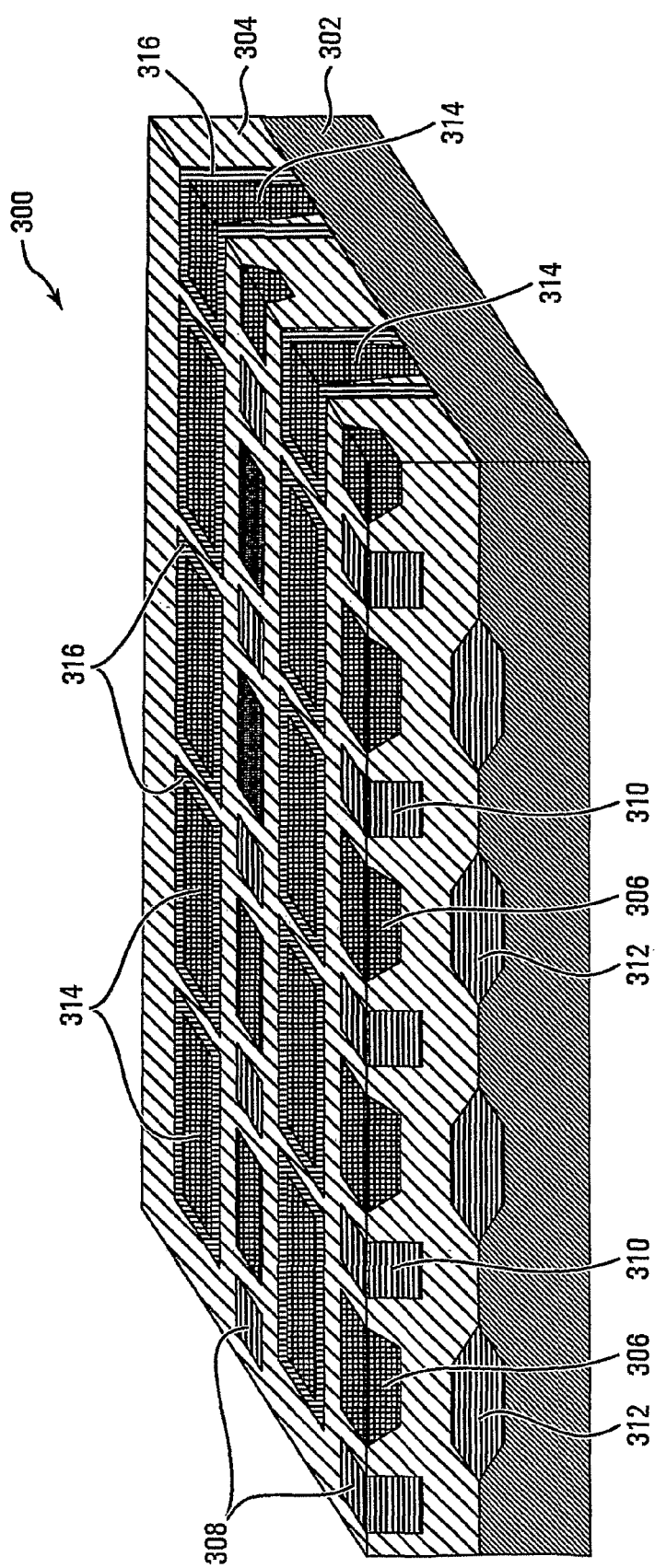
FIG. 3 is a cut-off perspective view of a sensor having multiple units similar to the device of FIG. 1D.

FIG. 3 illustrates a sensor 300 having multiple sensing units, each being formed of a sensor of device 100". Sensor 300 includes a bottom gate layer 302 ($p^-$), a conducting layer 304 ($n^-$), and multiple top gate regions 306 ($p^+$), source regions 308 ($n^+$), source/drain regions 310 ($n^+$), buried layers 312 ($n^+$), bottom gate contact regions 314 ($p^+$), and STI regions 316 each of which encloses a bottom gate contact region 314. As can be appreciated, a source/drain region 310 can act as a source for the unit on one side and as a drain for the unit on the other side. The addressing of the sensing units of sensor 300 can be readily carried out by person skilled in the art. For example, the source for an active unit may be grounded and its drain biased to the desired voltage, while all other, inactive units are put into a high impedance (HiZ) state. As mentioned above, STI regions 316 isolate bottom gate contact regions 314 from other regions so that the units can be densely disposed.

Figure 4A:
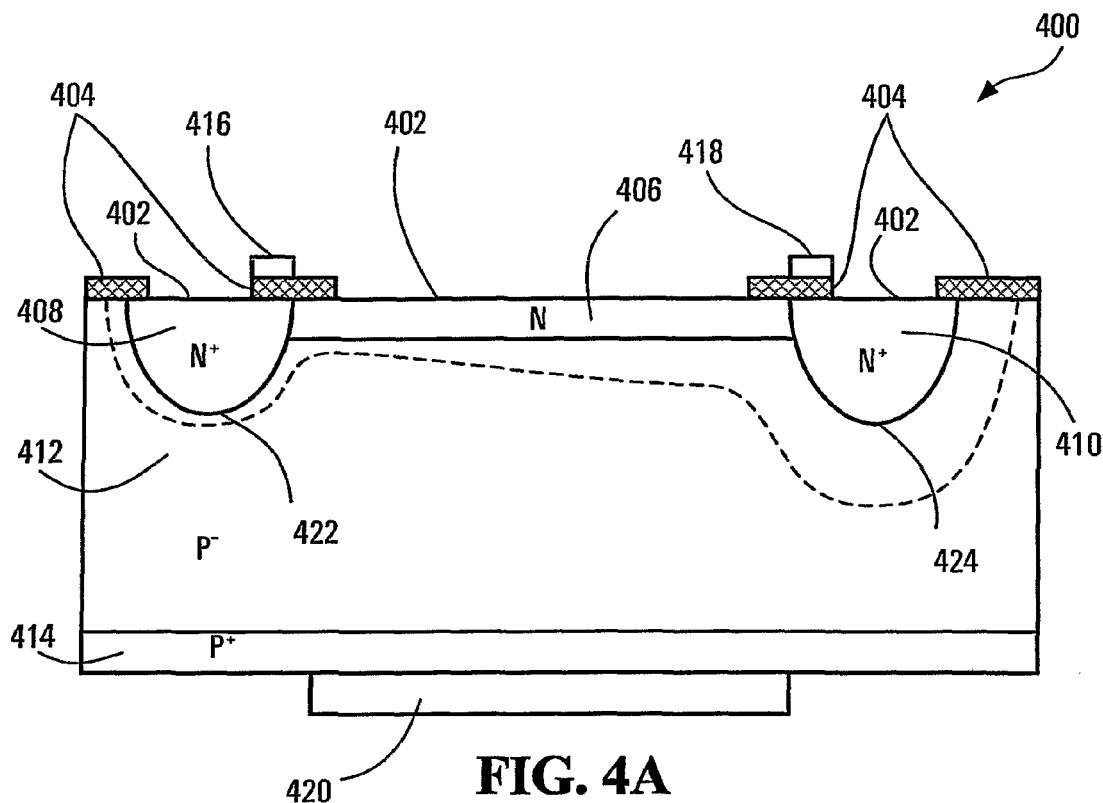
FIG. 4A is a schematic cross-sectional view of a photo-sensor, exemplary of an embodiment of the present invention.

Another exemplary embodiment of the present invention is a photo-sensor 400 illustrated in FIG. 4A. Sensor 400 has a light-transmitting surface 402 masked by an opaque layer 404. Below surface 402 is a doped, photo-conductive channel layer 406 connecting doped source region 408 and drain region 410, gate layer 412, gate contact region 414, and source, drain and gate electrodes 416, 418, and 420. Sensor 400 is somewhat similar to sensor 100'. However, channel layer 406 is directly beneath the top surface 402; the bottom of channel layer 406 is at a relative shallow depth; and channel layer 406 has a medium doping concentration, as indicated by the symbol "N", instead of low doping density of channel layer 108 in sensor 100'. As such, sensor 400 does not have a top gate layer. Rather, a continuous pn-junction is formed between gate layer 412 and channel layer 406, as well as between gate layer 412 and source and drain regions 408 and 410, of which two sections at the bottom of the source and drain regions are identified as pn-junctions 422 and 424, which define depletion regions proximate to pn-junctions 422 and 424 as indicated by the dashed line. The depths of the bottoms of channel 406 and source and drain regions 408 and 410 are chosen to generate charge carriers respectively in channel 406 and depletion regions proximate to junctions 422 and 424 in response to incident light of different wavelength bands on surface 402. For example, the bottom depth of channel 406 may be between 0.05 and 0.5 microns and the bottom depths of the source and drain regions 408 and 410 may be between 0.5 to 1 and 3 to 10 microns, respectively.

The electrical interconnects are in communication with the source and drain regions and the depletion regions.

In operation, electrodes 416 and 418 are biased so that a drain-source voltage ($V_{ds}$) is applied across source and drain regions 408 and 410. In FIG. 4, it is assumed that source electrode 416 is grounded, drain electrode 418 is positively biased and gate electrode 420 is negatively biased, but similar results may be obtained if the electrodes are biased in other suitable manners as will be understood by persons killed in the art.

As a result of the biasing, a conducting channel develops within channel layer 406 and a drain-source current can be established.

Further, depleted regions develop in the proximities of the pn-junction, particularly near junctions 422 and 424. Because the voltages across the junction are different, the widths of the depleted regions at junctions 422 and 424 are different— narrower at junction 422 and wider at junction 424. Thus, the two depleted regions will have different spectral response peaking at different wavelengths. By sensing output signals derived respectively from the two sections of the depleted region, additional spectral components of incident light can be determined.

Figure 4B:
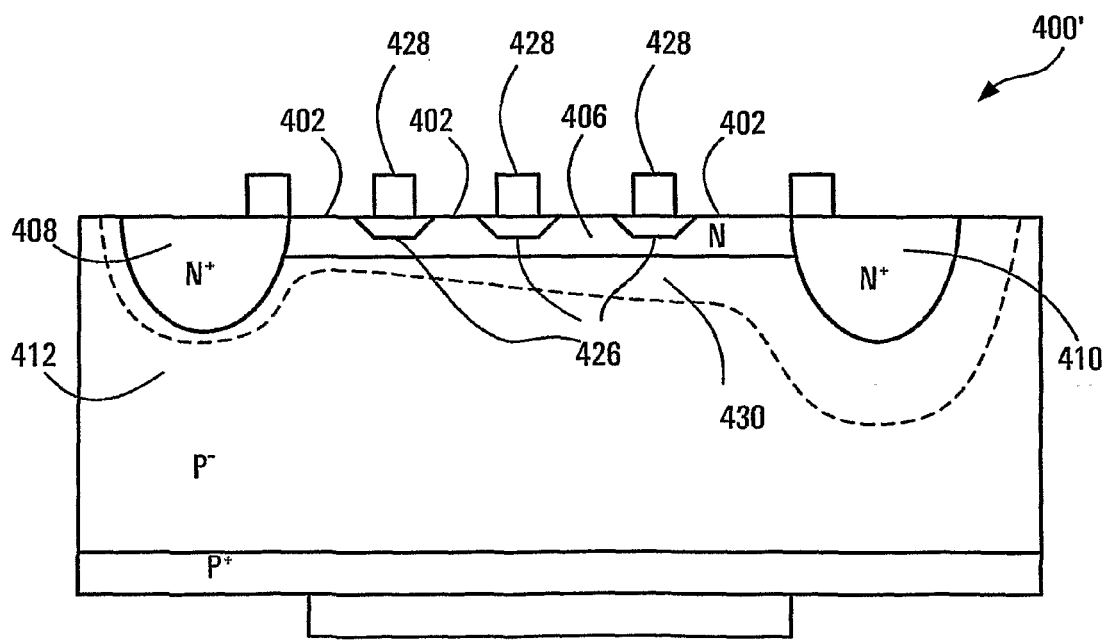
FIG. 4B is a schematic cross-sectional view of a variation of the photo-sensor of FIG. 4A.

A variation of sensor 400 is shown in FIG. 4B. Sensor 400' has a plurality of channel contact regions 426 ($n^+$) (only three are shown but there may be many more), each in contact with an electrode 428. Channel contact regions 426 can be shallow and regularly distributed between source and drain regions 408 and 410. As indicated, contact regions 426 have a higher doping concentration than channel 406. The width of each channel contact region 426 may be small, for example, as small as fabrication technique allowing. Channel layer 406 in sensor 400' can be lengthened to accommodate more channel contact regions 426. It is advantageous if the electrodes 428 are small in size as compared to channel contact regions 426 so that less light is blocked by electrodes 428.

In operation, electrodes 428 are not biased and the other electrodes are biased as for sensor 400. As a result, a depleted region 430 develops along channel layer 406. Depleted region 430 is narrower near source 408 but wider near drain 410. However, each section of depleted region 430 under a channel contact region 426 has a roughly constant width. Since the widths of different sections of depleted region 430 are different, different sections will have different spectral responses.

Figure 4C:
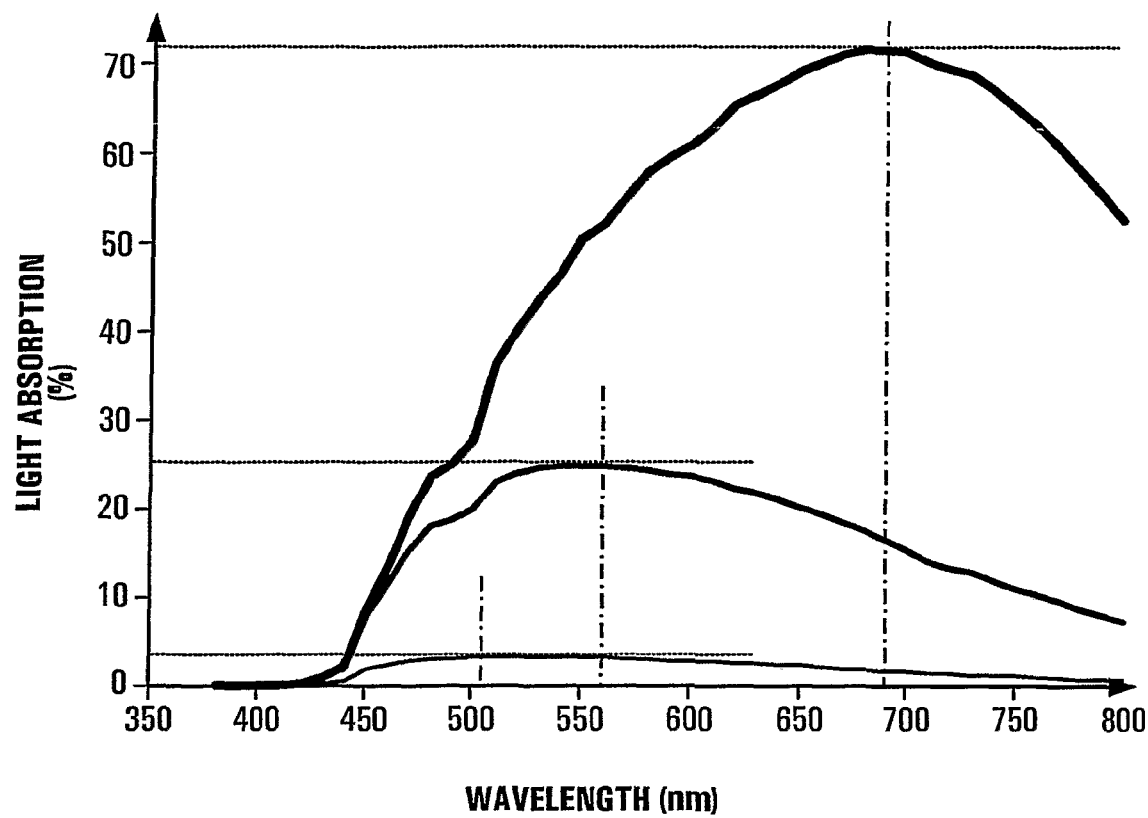
FIG. 4C is a line-graph showing example spectral responses of depleted regions.

FIG. 4C illustrates exemplary spectral responses of depletion regions having different widths (0.1, 1, and 10 μm for the bottom, middle and top curves, respectively), developed from a pn-junction at a depth of 1 μm. As can be seen, the peak for a depleted section of wider width is red-shifted and is higher in amplitude. When constant bias voltages are applied to the source, drain and gate, electrodes 428 can be used to determine the voltage variation along the channel due to photo-generated electron flow in the channel, which is dependent on the spectral components of light incident on surface 402. By choosing for each channel contact region 426 a certain width (along the horizontal direction as depicted) and the number of such contact regions along the channel, different spectral analyses can be performed. By choosing a certain depth of the channel pn-junction and varying the width of its depleted region, spectral components of light can be detected from the magnitude of voltage drop along the channel due to flow of photo-generated electron. The dependence of the spectral response on junction depth, depletion with and gate region length can be readily determined by persons skilled in the art. Further, the slope of width increase in depleted region 430 along the channel can be adjusted by adjusting the drain biasing voltage, while adjusting the biasing voltage on the bottom gate electrode can affect the width across the entire depleted region 430 uniformly. As can be understood, in this case, the output signals can be the voltage signals and the effect of light can be determined by comparing the voltage signals obtained respectively with and without illumination.

Alternatively, sensor 400' may be operated as follows. Source and drain regions 408 and 410 are initially biased to the same potential. An increasingly higher voltage pulse is sequentially applied to each channel contact region 426, for example, starting from the one nearest to source region 408. Finally, a highest voltage pulse is applied to drain region 410. During the application of a voltage pulse at a particular region, the depletion region near the particular region will expand temporarily and locally. The extent of expansion will depend on the value of the voltage applied. When the voltage pulse is applied, a current detected from the particular region can be indicative of light absorbed in this temporarily expanded depletion region. As can be appreciated, different wavelength bands of incident light can be determined along the channel with this "scanning" mode of operation.

Thus, sensor 400' can be adapted for use in various spectrometric-like applications and can be readily controlled electronically.

Figure 4D:
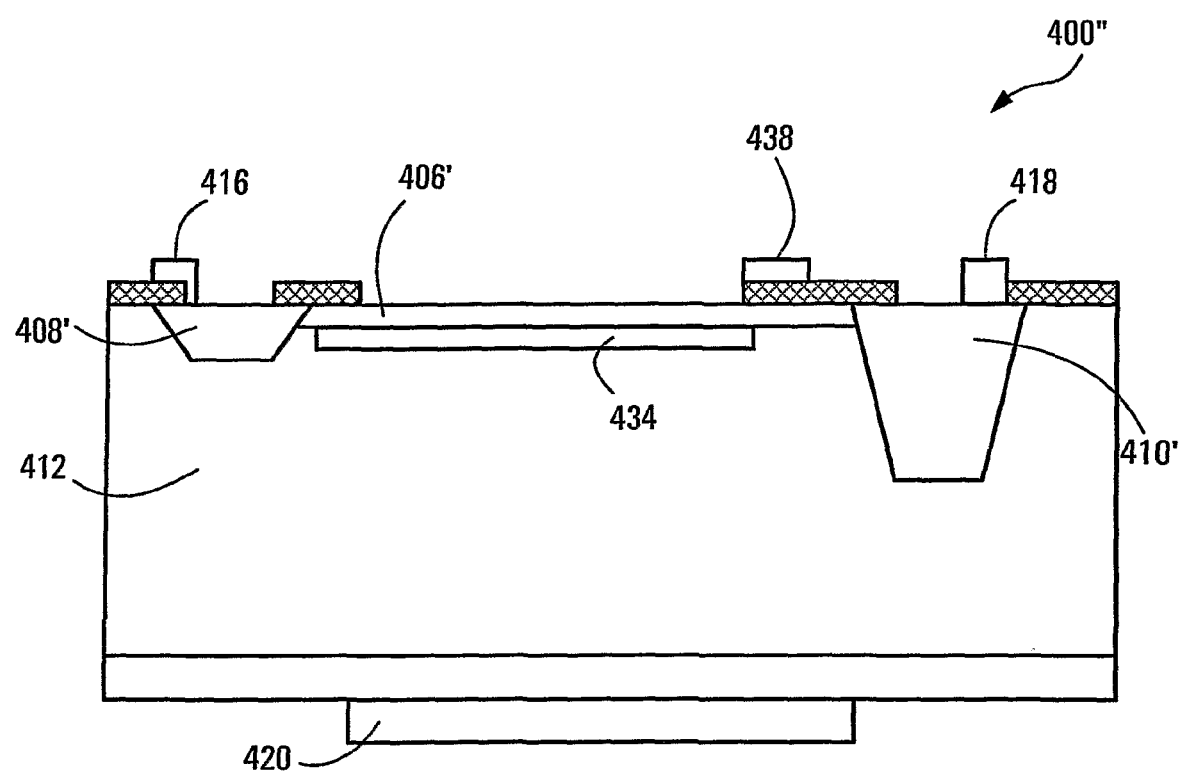
FIG. 4D is a schematic cross-sectional view of a variation of the photo-sensor of FIG. 4A.

Another variation of sensor 400 is shown in FIG. 4D. In sensor 400", a buried layer 434 ($p^+$) is provided below channel layer 406' within gate layer 412. Source region 408' and drain region 410' have flat bottoms at different depths. As can be appreciated, when the electrodes are appropriately biased, depleted regions around source and drain regions 408' and 410' will develop at different depths. Moreover, because buried region 434 has a doping level much higher than that of channel layer 406' and that of gate region 412, the depletion region around the pn-junction between layers 406' and 434 will mainly develop within channel layer 406'. It is also possible that this depletion region is very thin. Source-to-gate and drain-to-gate currents can be detected from gate electrode 438 and used to provide a signal, for example responsive to violet-blue illumination. Different spectral components of incident light, such as 'green' and 'red' components, may be detected by choosing different bottom depths of the source and drain regions 408' and 410' and/or applying different biasing voltages, as can be understood by persons skilled in the art. Bottom gate electrode 420 may be used to detect a signal indicative of the total intensity of light absorbed by sensor 400".

Figure 4E:
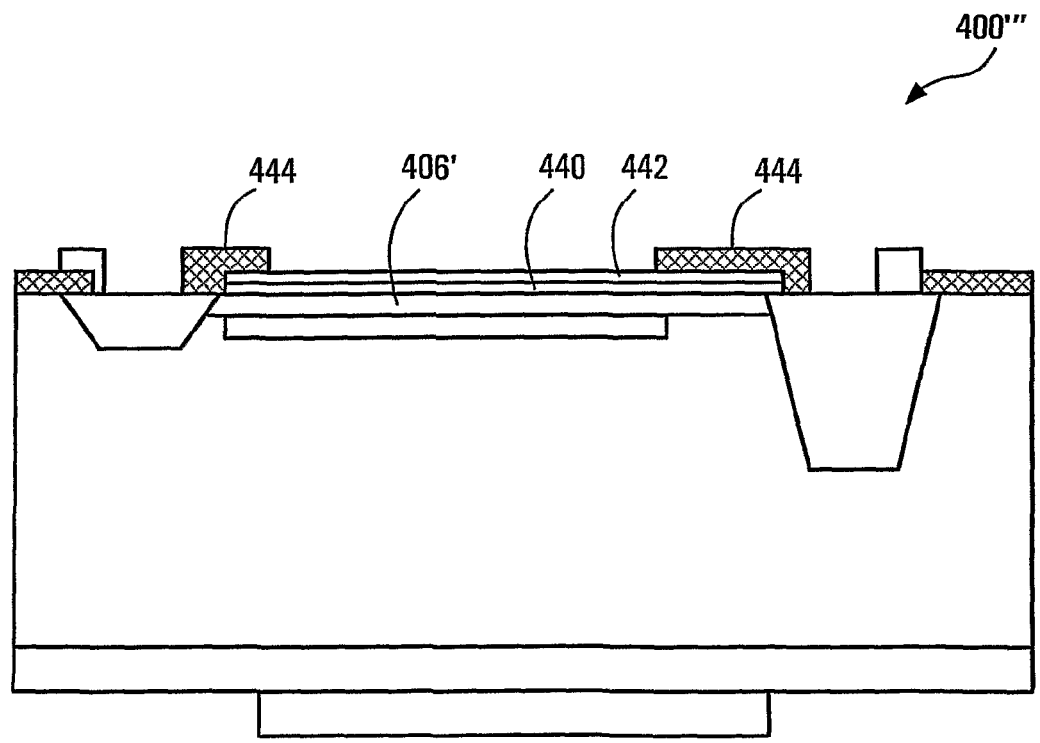
FIG. 4E is a schematic cross-sectional view of a variation of the photo-sensor of FIG. 4D.

A variation of sensor 400" is shown in FIG. 4E. In sensor 400''', a MOS gate is formed on top of channel 406'. The MOS gate includes an oxide layer 440 and a transparent metal layer 442 which can be made of indium-tin oxide (ITO). The MOS gate is shielded by an opaque layer 444. The operation of a MOS gate and thus sensor 400''' can be readily understood by persons skilled in the art after reviewing this description.

Other variations of sensor 400 are also possible. For example, a number of discrete, strongly doped p-type regions may be formed at various locations in channel 406 extending from surface 402 to gate layer 412. These p-type regions may be biased to control the width of depletion region along channel 406. These p-type regions may also be used to detect additional signals.

As now can be understood, embodiments of the present invention are not limited to detecting three spectral components of light. More or less components can be detected. Particularly, many spectral components can be detected by developing conducting channel(s) and depleted region(s) at different depths below the light-transmitting surface. Further, the spectral components detectable are not limited to the visible spectrum of light. Both colorimetric and spectrometric analysis of light can be performed with embodiments of the present invention.

Figure 4F:
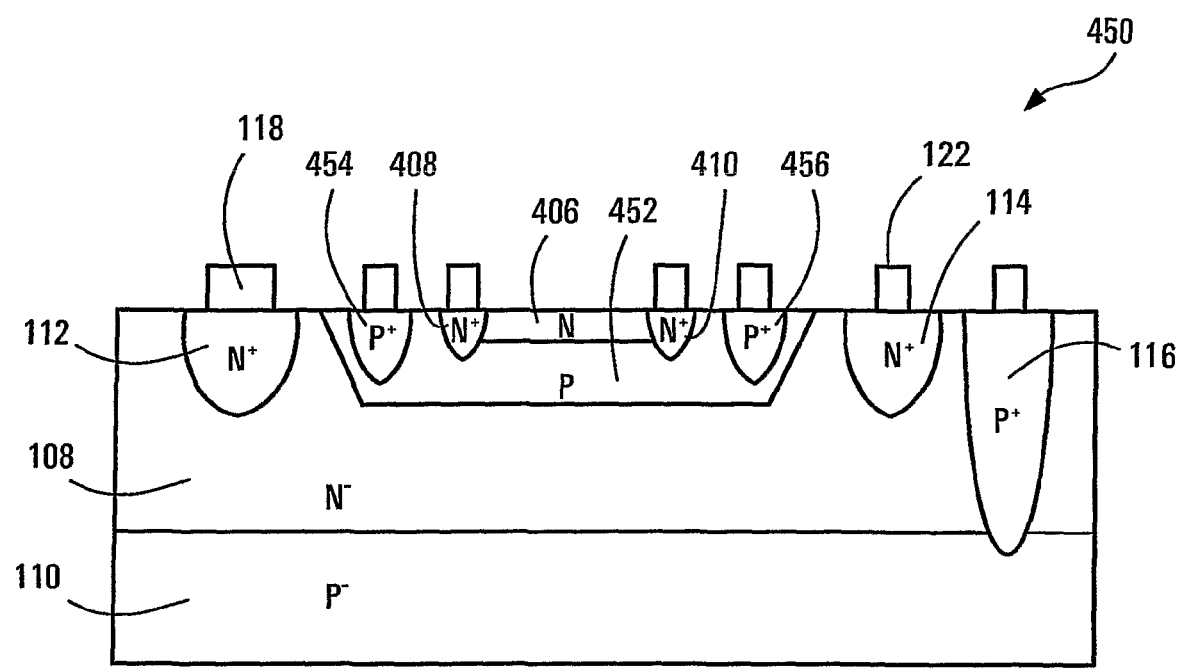
FIG. 4F is a schematic cross-sectional view of a sensor integrating the sensors of FIGS. 1A and 4A.

For the purpose of detecting more than three spectral components, the different sensors described above can also be combined or integrated into a single device. For example, device 100 or sensor 400 may be combined or integrated, as illustrated in FIG. 4F. As can be appreciated, the integrated sensor 450 is essentially a sensor 100 stacked under a sensor 400. However, gate layer 412 of sensor 400 is merged with the top gate layer 106 of sensor 100 to form a new channel 452, in contact with source and drain regions 454 and 456 respectively. Channel 452 is of p-type and is normally doped. Regions 454 and 456 are strongly doped p-type regions. Thus, three channels are formed in sensor 450. A pn-junction is formed between each pair of adjacent channels. As can be appreciated, such a combined device can be operated to develop three conducting channels and at least three depleted regions at different depths.

Figure 5A:
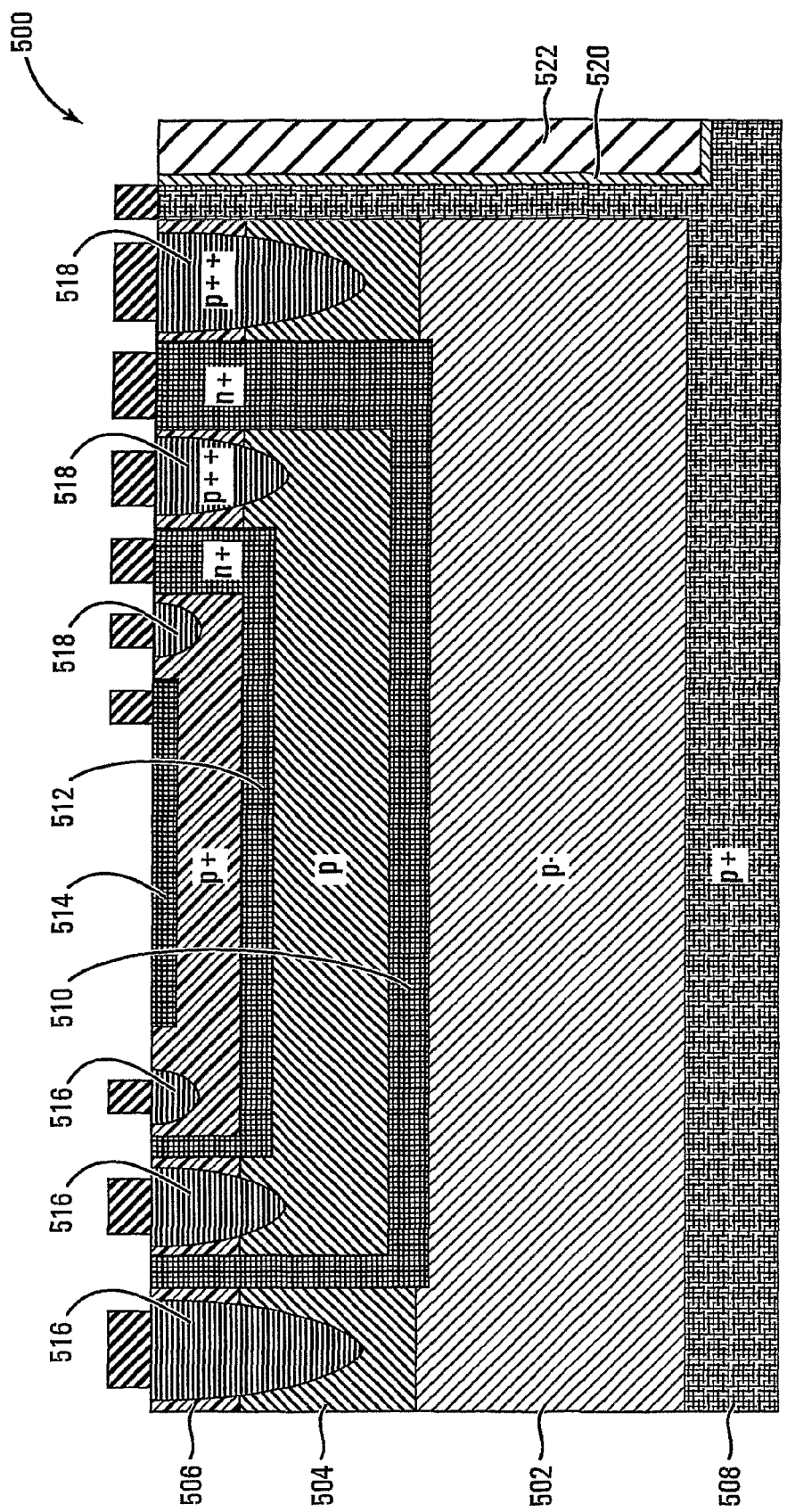
FIG. 5A is a schematic cross-sectional view of a compound sensor.
Figure 5B:
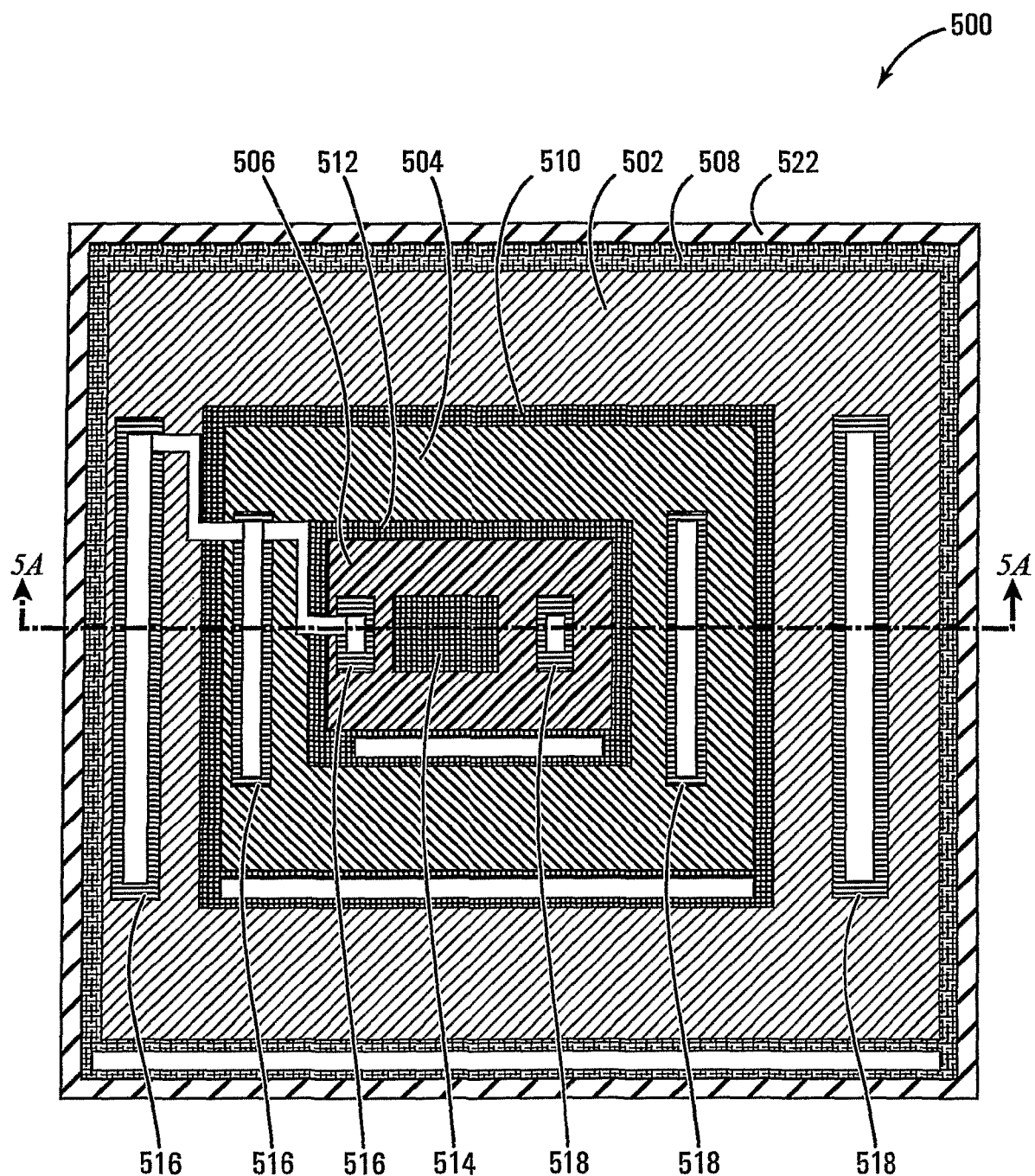
FIG. 5B is a schematic top view of the compound sensor of FIG. 5A.

To improve signal quality, a combined device may include buried layers to isolate the channels, such as illustrated in FIGS. 5A and 5B. As can be seen, sensor 500 includes p-type channel layers 502 ($p^-$), 504 (p) and 506 ($p^+$), and n-type gate layers 508 ($n^+$), 510 ($n^+$), 512 ($n^+$) and 514 ($n^+$). Each channel layer is connected to a pair of source region 516 ($p^{++}$), and drain region 518 ($p^{++}$), which have different depths according to the depth of the corresponding channel in which they are realized. The doping concentrations of the layers are indicated by the signs which have similar meaning as discussed above. Further, the double-plus sign "++" indicates that the doping concentration is higher than a "+" region or layer. For instance, $10^{14}$-$10^{16}$ cm$^{-3}$ for "$p^-$", $10^{16}$-$10^{17}$ cm$^{-3}$ for "p", $10^{17}$-$10^{18}$ cm$^{-3}$ for "$p^+$", $10^{18}$-$10^{19}$ cm$^{-3}$ for "$n^+$", and $10^{19}$-$10^{20}$ or higher for "$p^{++}$" or "$n^{++}$".

As can be understood, three JFETs are thus formed. The strongly doped gate layers separate the channel layers of the JFET from one another. As can be appreciated, sensor 500 includes layers of alternating conductive types formed on a substrate, extending away from the top surface, thus forming pn-junctions at different depths relative to the surface and three channels, each between two adjacent pn-junctions. For each channel, doped drain and source regions are formed on the substrate in communication with the channel. Electrical interconnects in communication with each pn-junction are also provided. The different depths can be chosen to generate charge carriers in response to light of different wavelength bands incident on the surface the respective regions or channels.

Using insulation methods such as the Shallow Trench Isolation (STI) technique, efficient electrical insulation can be provided in such a sensor for insulating it from its neighbors as well as for insulating various components on it. The insulation can be achieved by first etching a trench in the desired separation area, as illustrated in FIG. 5A. As shown, sensor 500 also includes a SiO$_2$ layer 520 defining a trench (not shown in FIG. 5B) and a polySi layer 522 (may be strongly doped in-situ) serving as a filler in the trench to reduce stress due to mismatch of thermal expansion between different materials.

Channel layers 502, 504 and 506 may be grown epitaxially. Their thickness may be respectively 10-20 μm for layer 502, 2-4 μm for layer 504, and 0.05-0.2 μm for layer 506. Each gate layer may have a suitable thickness. Gate layer 514 is optional and should be shallow, such as having a thickness of about 0.05-0.1 μm or thinner. Source and drain regions 516 and 518 can be formed by diffusion.

Figure 5C:
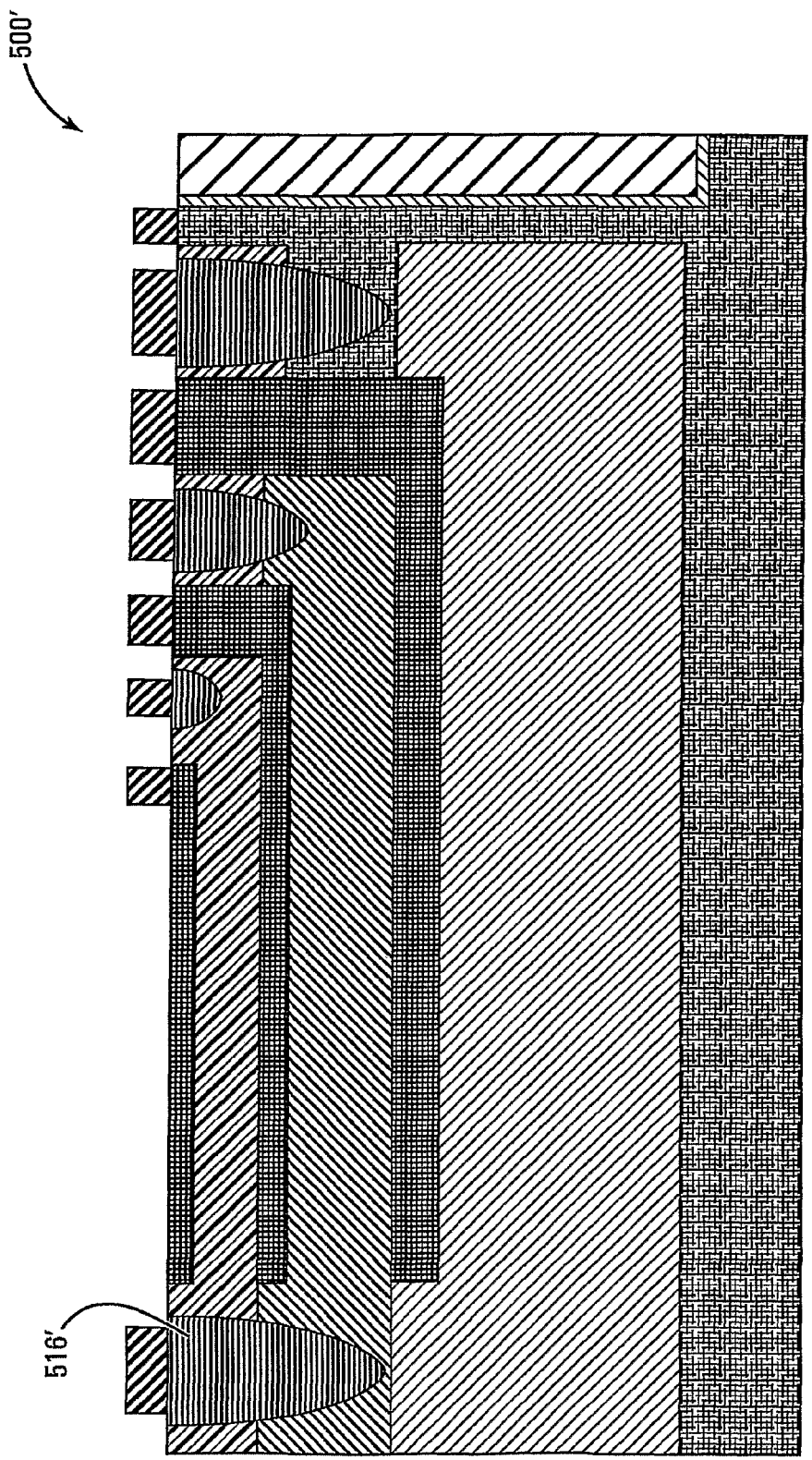
FIG. 5C is a schematic cross-sectional view of a variation of the compound sensor of FIG. 5A.
Figure 5D:
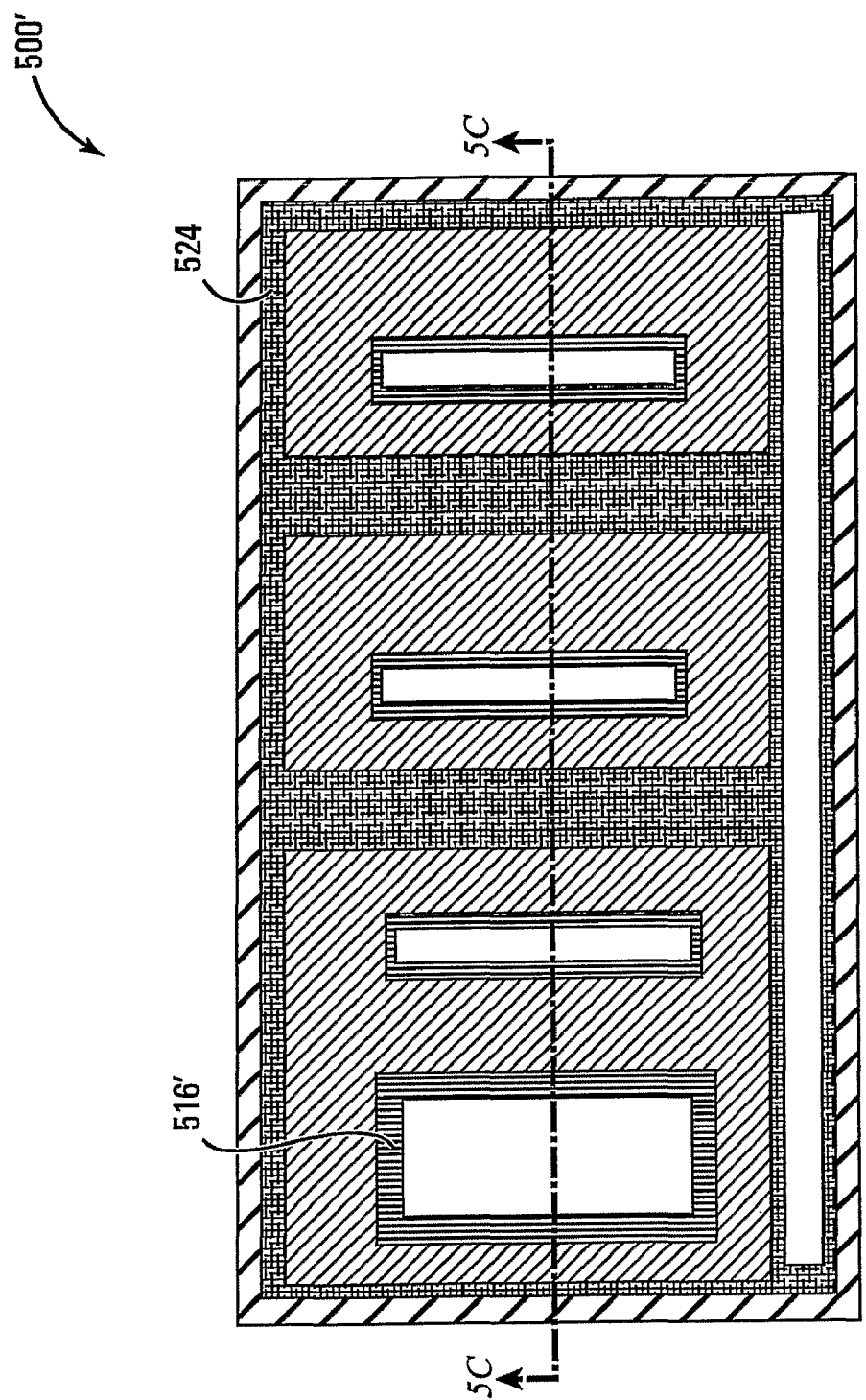
FIG. 5D is a schematic top view of the variation of FIG. 5C.
Figure 5E:
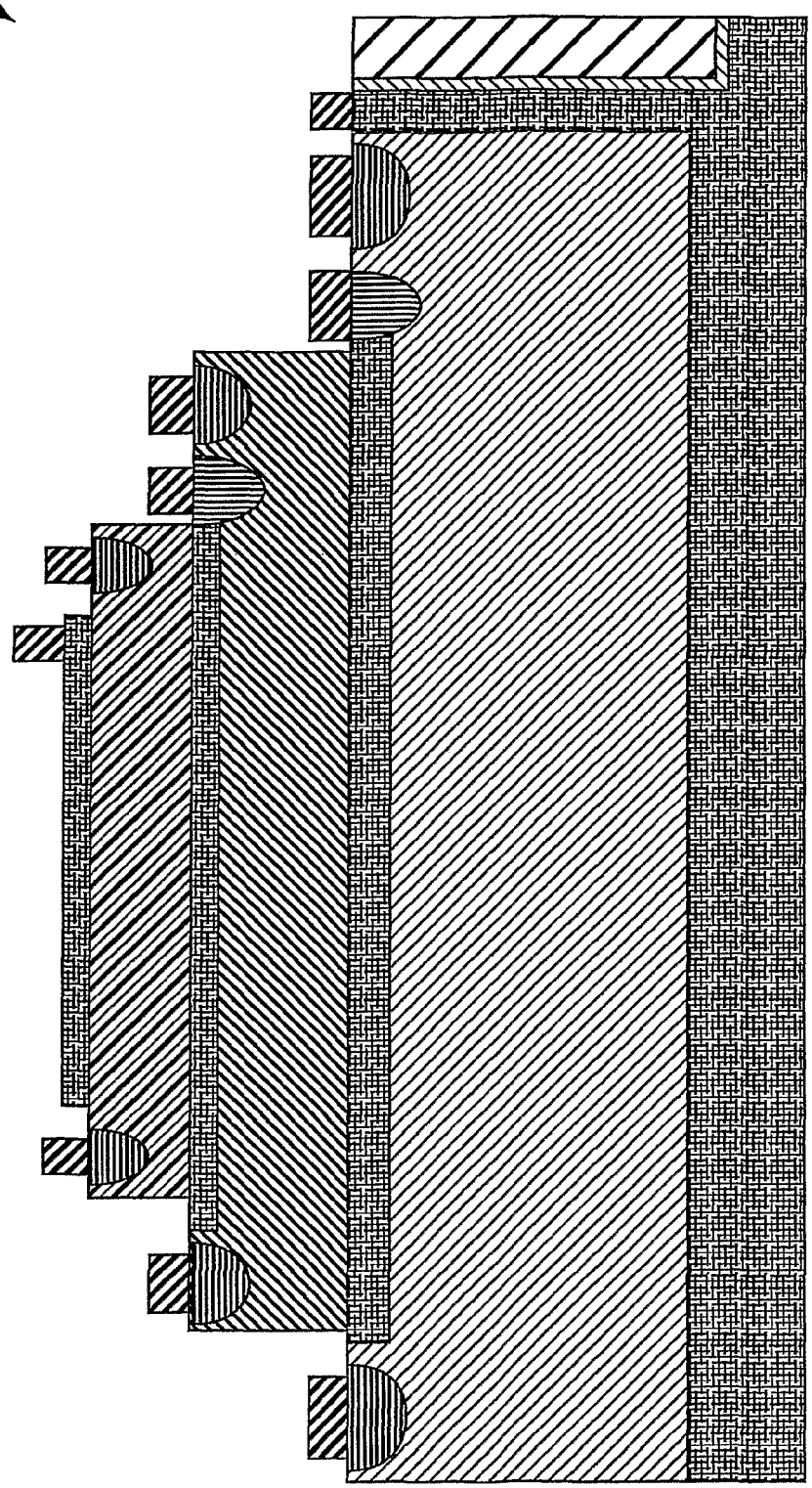
FIG. 5E is a schematic cross-sectional view of another variation of the compound sensor of FIG. 5A.

Possible variations of sensor 500 are shown in FIGS. 5C, 5D, and 5E. As can be appreciated, sensor 500' may be advantageous because the JFETs share a common source region 516'. Further, the JFETs can share a common gate signal as the gate regions are merged into a single gate region 524, as shown in FIG. 5D. Sensor 500" may be advantageous because it can be more convenient to manufacture as trench etching and filling may not be necessary and fewer masks are required during manufacture. For example, a layer or region may be epitaxially grown, which may be more convenient to produce than a deep, strongly doped layer produced by diffusion.

Figure 6C:
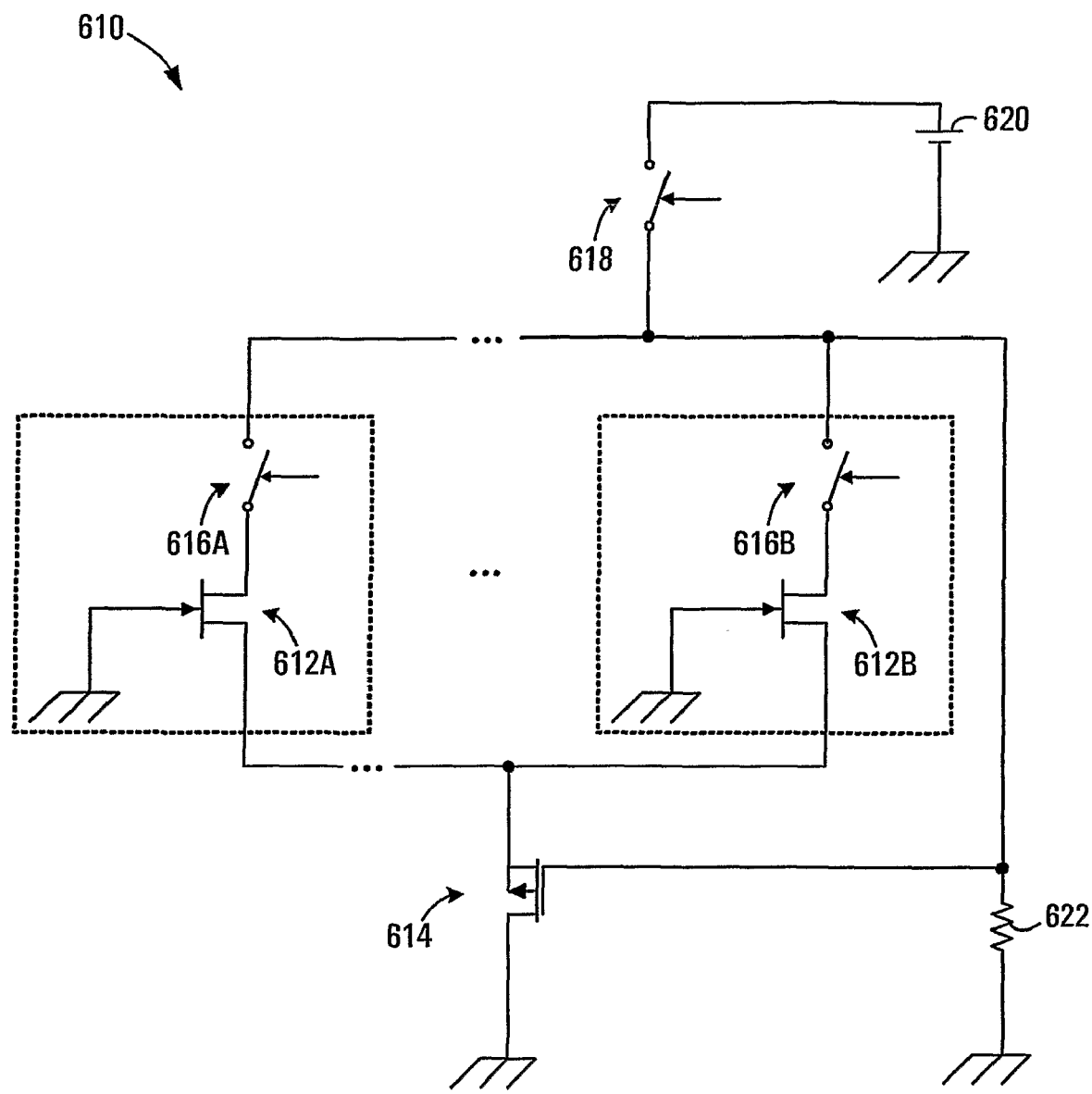
FIG. 6C is a circuit diagram for a sensor array.
Figure 6A:
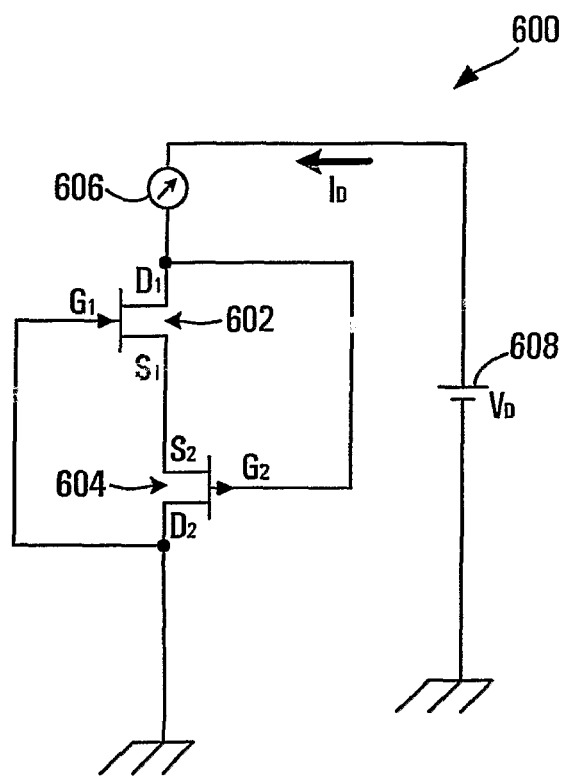
FIG. 6A is a circuit diagram for a λ-diode.

FIG. 6A illustrates a dual-JFET device 600 which includes a JFET described above. Device 600 falls with in a type of devices known as "λ-diode". Device 600 includes an n-channel JFET 602 and a p-channel JFET 604. One or both of the JFETs 602 and 604 are according to the JFET structures described above. The sources (S1, S2) of the two JFETS are connected (shorted). The gate (G1 or G2) of each JFET is connected to the drain (D2 or D1) of the other JFET.

Figure 6B:
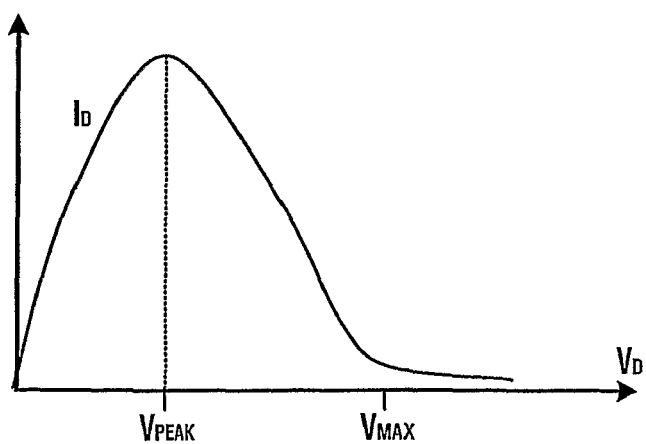
FIG. 6B is a line-diagram showing the I-V profile for the λ-diode of FIG. 6A.

In operation, a voltage $V_d$ is applied across the drains (D1 and D2) by a source 608. The drain currents $I_d$ can be measured using an ammeter 606. A typical $I_d$-$V_d$ profile is shown in FIG. 6B. As can be seen, there are three possible operation modes for the λ-diode: (a) $V_D < V_{Peak}$; (b) $V_{Peak} < V_D < V_{Max}$; and (c) $V_D > V_{Max}$. In modes (a) or (b), illuminating JFET 602 (or 604) with light can induce a change in $I_d$ as compared to the quiescent drain current. This change can be used to derive an output signal indicating the intensity of light absorbed in the conducting channel of the JFET 602 (or 604). In operation mode (c), the dark or quiescent drain current is at or near zero. As will be understood, it can be advantageous to have a photo-sensor or sensing unit operating in this "normal-off"

mode. For example, in a normal-off mode, the drain current can be used directly as an indication of the intensity of light absorbed in the conducting channel of one or both of the JFETs 602 and 604, without having to compare with a quiescent drain current.

FIG. 6C illustrates a device 610 having an n-channel JFET (612) sensor array coupled to a p-channel MOSFET 614. There can be a number (N) of JFETs 612, where N≧2, but only two (612A and 612B) are shown for clarity reasons. The single MOSFET 614 couples to each n-channel JFET 612 in the array to form a λ-diode. The circuit of device 610 also includes a switch 616 connected to each JFET 612. Each switch 616 is connected to an array switch 618, which is in turn connected to a signal source 620. Device 600 is grounded through resistor 622.

MOSFET 614 can be a depletion-MOS (d-MOS) transistor. It may be desirable that this p-channel d-MOS transistor has a high threshold voltage, such as comparable to the cut-off voltage of JFETs 612 so that their current-voltage characteristics are complementary. A p-channel d-MOS transistor is advantageous because it is easy and convenient to form a MOS transistor in the CMOS technology, especially when n-channel JFETs have to be formed on the same device.

As can be understood, when switch 618 is "ON", the λ-diodes in the array may become functional sequentially. When switch 618 is "OFF", the gate of MOSFET 614 is grounded through resistor 622. In operation, switch 618 is switched to "ON". Switches 616 are sequentially turned "ON" or "OFF" to select a particular JFET 612 for sensing light. Only one switch 616 is turned to "ON" at a time so that the associated JFET 612 becomes active and the other ones are inactive. When a JFET 612 is active, it can be used to detect spectral components of light as described above. When JFETs 612 are selected sequentially at regular time intervals, the active JFET can be identified.

Any suitable semiconductor material may be used to form any of the above described photo-sensors or sensing devices. For example, silicon and a silicon-based compound substance may be used. The base semiconductor can be doped with any suitable doping material to obtain the desired layers or regions. For example, phosphorus or arsenic may be used as dopant for forming layers of n-type conductivity, and boron may be used for p-type layers.

As can be appreciated by persons skilled in the art, a p-channel JFET can be used in place of an n-channel JFET in some of the exemplary embodiments described above. The operation of a p-channel JFET is similar to that of an n-channel JFET, except for a reversal of polarities of all currents and voltages. Further, in many situations, the source and drain of a JFET are interchangeable.

Other features, benefits and advantages of the embodiments described herein not expressly mentioned above can be understood from this description and the drawings by those skilled in the art.

Of course, the above described embodiments are intended to be illustrative only and in no way limiting. The described embodiments are susceptible to many modifications of form, arrangement of parts, details and order of operation. The invention, rather, is intended to encompass all such modification within its scope, as defined by the claims.

What is claimed is:

1. A method of photo-sensing comprising:
biasing a junction field effect transistor (JFET) to generate a conducting channel between a source and a drain of said JFET, said conducting channel having an absorption section below a light-transmitting surface of said JFET, said absorption section having a pre-determined photo-conductivity spectral response, and
at least two depleted regions below said light-transmitting surface, each having a photo-electric spectral response peaking at a distinct, pre-determined wavelength;
illuminating said light-transmitting surface with light;
sensing an output signal derived from said channel indicative of the intensity of light absorbed therein; and
for each particular one of said depleted regions, sensing an output signal derived from said particular depleted region indicative of the intensity of light absorbed therein, wherein said one or more depleted regions comprise two depleted regions at different depths below said light-transmitting surface; wherein said sensing an output signal comprises sensing a drain-source current from said drain to said source through said conducting channel, and wherein said sensing an output signal derived from said particular depleted region comprises sensing a gate current from a gate in contact with said particular depleted region; and wherein said sensing a drain-source current comprises:
sensing a drain-source photo-induced current variation based on: sensing a drain current from said drain during said illuminating, obtaining a quiescent drain-source current, and calculating said photo-induced drain-source current variation by subtracting from said drain current said quiescent drain-source current and the sum of said gate currents.

2. The method of claim 1, wherein obtaining a quiescent drain-source current comprises sensing a quiescent source current from said source and a quiescent drain current from said drain without illuminating said light-transmitting surface and calculating said quiescent drain-source current by subtracting said quiescent source current from said quiescent drain current.

3. The method of claim 2, further comprising:
sensing a quiescent source current from said source regions in dark conditions,
sensing a source current from said source regions during said illuminating, and
calculating said photo-induced drain-source current variation by subtracting from said source current said quiescent source current.

4. The method of claim 1, wherein said pre-determined wavelengths are selected such that a plurality of different spectral components of said light can be determined from said output signals.

5. The method of claim 4, wherein said plurality of spectral components comprise a blue component, a green component and a red component.

6. The method of claim 5, wherein said blue component covers wavelengths below about 500 nm, said green component covers wavelengths from about 500 to about 600 nm, said red component covers wavelengths above about 600 nm.

* * * * *

UNITED STATES PATENT AND TRADEMARK OFFICE
CERTIFICATE OF CORRECTION

| | | |
|---|---|---|
| PATENT NO. | : 8,093,633 B2 | Page 1 of 1 |
| APPLICATION NO. | : 10/587493 | |
| DATED | : January 10, 2012 | |
| INVENTOR(S) | : Daniel Puiu Poenar et al. | |

It is certified that error appears in the above-identified patent and that said Letters Patent is hereby corrected as shown below:

On the title page

(75) Inventors:

~~Daniel Pulu Poenar~~

Daniel Puiu Poenar

Signed and Sealed this
Twenty-fourth Day of September, 2013

Teresa Stanek Rea
*Deputy Director of the United States Patent and Trademark Office*